US012598830B2

(12) United States Patent
Yoshida et al.

(10) Patent No.: US 12,598,830 B2
(45) Date of Patent: Apr. 7, 2026

(54) SOLID-STATE IMAGING ELEMENT AND MANUFACTURING METHOD THEREOF

(71) Applicant: SONY SEMICONDUCTOR SOLUTIONS CORPORATION, Kanagawa (JP)

(72) Inventors: Shinichi Yoshida, Kanagawa (JP); Ryoji Hasumi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 311 days.

(21) Appl. No.: 18/251,879

(22) PCT Filed: Oct. 28, 2021

(86) PCT No.: PCT/JP2021/039805
§ 371 (c)(1),
(2) Date: May 4, 2023

(87) PCT Pub. No.: WO2022/102424
PCT Pub. Date: May 19, 2022

(65) Prior Publication Data
US 2024/0014240 A1 Jan. 11, 2024

(30) Foreign Application Priority Data
Nov. 12, 2020 (JP) ................................. 2020-188719

(51) Int. Cl.
H10F 39/00 (2025.01)
H10F 39/18 (2025.01)
(52) U.S. Cl.
CPC ......... H10F 39/807 (2025.01); H10F 39/011 (2025.01); H10F 39/182 (2025.01);
(Continued)

(58) Field of Classification Search
CPC .. H10F 39/807; H10F 39/182; H10F 39/8063; H10F 39/011; H10F 39/811; H10F 39/8057
See application file for complete search history.

(56) References Cited

U.S. PATENT DOCUMENTS

| | | | |
|---|---|---|---|
| 2014/0054662 A1* | 2/2014 | Yanagita | ............. H10F 39/8033 438/73 |
| 2015/0028442 A1* | 1/2015 | Miyanami | ........... H10F 39/8057 438/69 |

(Continued)

FOREIGN PATENT DOCUMENTS

| | | |
|---|---|---|
| CN | 112385041 A | 2/2021 |
| JP | 2013-175494 A | 9/2013 |

(Continued)

OTHER PUBLICATIONS

International Search Report and Written Opinion of PCT Application No. PCT/JP2021/039805, issued on Dec. 28, 2021, 11 pages of ISRWO.

*Primary Examiner* — Sardis F Azongha
(74) *Attorney, Agent, or Firm* — CHIP LAW GROUP

(57) ABSTRACT

Provided is a solid-state imaging element that includes a substrate, a plurality of photoelectric conversion units that is provided in the substrate, and a first insulation film that is provided between the plurality of photoelectric conversion units adjacent to each other among the plurality of photoelectric conversion units, and has a fixed charge provided on an inner wall of a trench penetrating between a first surface of the substrate and a second surface opposite to the first surface. The solid-state imaging element further includes a second insulation film that is provided on an inner side of the first insulation film in the trench, at least one transistor that is provided on the first surface of the substrate, and a third (Continued)

insulation film that is provided on both sides of the trench or along the trench when viewed from the first surface.

23 Claims, 27 Drawing Sheets

(52) U.S. Cl.
CPC ..... *H10F 39/8057* (2025.01); *H10F 39/8063* (2025.01); *H10F 39/811* (2025.01)

(56) References Cited

U.S. PATENT DOCUMENTS

| | | | |
|---|---|---|---|
| 2015/0372031 A1 | 12/2015 | Yoon et al. | |
| 2018/0190692 A1 | 7/2018 | Choi et al. | |
| 2019/0115375 A1 | 4/2019 | Nah et al. | |
| 2020/0219911 A1* | 7/2020 | Hur ...................... | H10F 39/802 |

FOREIGN PATENT DOCUMENTS

| | | |
|---|---|---|
| JP | 2014-131083 A | 7/2014 |
| JP | 2015-162679 A | 9/2015 |
| JP | 2019-145544 A | 8/2019 |
| JP | 2020-013817 A | 1/2020 |
| TW | 201543659 A | 11/2015 |
| TW | 202029489 A | 8/2020 |
| WO | 2019/093150 A1 | 5/2019 |

* cited by examiner

SOLID-STATE IMAGING ELEMENT AND MANUFACTURING METHOD THEREOF

CROSS REFERENCE TO RELATED APPLICATIONS

This application is a U.S. National Phase of International Patent Application No. PCT/JP2021/039805 filed on Oct. 28, 2021, which claims priority benefit of Japanese Patent Application No. JP 2020-188719 filed in the Japan Patent Office on Nov. 12, 2020. Each of the above-referenced applications is hereby incorporated herein by reference in its entirety.

TECHNICAL FIELD

The present disclosure relates to a solid-state imaging element and a manufacturing method thereof.

BACKGROUND ART

In a solid-state imaging element, a plurality of adjacent pixels may be physically isolated by a through trench. A fixed charge film is formed on a sidewall of such a through trench, and the fixed charge film induces a charge accumulation region around the sidewall of the through trench.

However, when the charge accumulation region comes into contact with a source diffusion layer or drain diffusion layer of a transistor of the pixel, a high-concentration PN junction is formed, and the PN junction generates a strong electric field. This strong electric field generates a dark current and causes random noise.

Furthermore, in a case where the through trench is formed before the formation of a pixel transistor, a material for filling the through trench needs to be a heat-resistant material that can withstand high-temperature processing in a step of forming the pixel transistor. For this reason, a metal material having low heat resistance cannot be used, and it is necessary to use polysilicon, a silicon nitride film, a silicon oxide film, or the like, which has high heat resistance. However, since the polysilicon, the silicon nitride film, the silicon oxide film, and the like have low light shielding properties, light leaks between adjacent pixels and crosstalk is caused.

CITATION LIST

Patent Document

Patent Document 1: WO 2019/093150 A

SUMMARY OF THE INVENTION

Problems to be Solved by the Invention

Provided is a solid-state imaging element capable of reducing random noise in a pixel and suppressing leakage of light between adjacent pixels.

Solutions to Problems

According to an aspect of the present disclosure, there is a solid-state imaging element including: a substrate; a plurality of photoelectric conversion units that is provided in the substrate; a first insulation film that is provided between the plurality of photoelectric conversion units adjacent to each other among the plurality of photoelectric conversion units, and has a fixed charge provided on an inner wall of a trench penetrating between a first surface of the substrate and a second surface opposite to the first surface; a second insulation film that is provided on an inner side of the first insulation film in the trench; at least one transistor that is provided on the first surface of the substrate; and a third insulation film that is provided on both sides of the trench or along the trench when viewed from the first surface.

The third insulation film is interposed between a charge induction layer formed on a surface of the substrate adjacent to the first charge film and a source or drain of the transistor.

The charge induction layer is a high-concentration charge layer of a first conductivity type, and the source or drain of the transistor is a high-concentration impurity diffusion layer of a second conductivity type.

The charge induction layer is an impurity diffusion layer of a first conductivity type.

The third insulation film covers ends of the first and second insulation films on the first surface side.

The ends of the first and second insulation films on the first surface side penetrate the third insulation film.

There are further provided: a wiring layer that is provided on the first surface of the substrate and electrically connected to the transistor; and a lens that is provided on the second surface of the substrate.

There is further provided a light shielding film that is provided on an inner side of the second insulation film in the trench.

The third insulation film overlaps the first and second insulation films when the substrate is viewed from a direction perpendicular to the first surface.

A width of the third insulation film is greater than a width of the trench when the substrate is viewed from a direction substantially perpendicular to the first surface.

A width of the third insulation film is greater than a width of the charge induction layer provided on both sides of the trench when the substrate is viewed from a direction substantially perpendicular to the first surface.

A depth of the third insulation film from the first surface is deeper than a depth of a diffusion layer of the transistor adjacent to the third insulation film.

According to another aspect of the present disclosure, there is provided a manufacturing method of a solid-state imaging element, the method including: forming a plurality of photoelectric conversion units in a substrate; forming, on a first surface of the substrate, a third insulation film between the photoelectric conversion units adjacent to each other among the plurality of photoelectric conversion units; forming, between the plurality of adjacent photoelectric conversion units, a trench penetrating between the first surface of the substrate and a second surface opposite to the first surface; forming, on an inner wall of the trench, a first insulation film having a fixed charge; forming, in the trench, a second insulation film on an inner side of the first insulation film; and forming at least one transistor on the first surface of the substrate.

The method further includes introducing an impurity of a first conductivity type into the inner wall of the trench to form a charge induction layer on the inner wall of the trench.

The trench penetrates the third insulation film.

According to still another aspect of the present disclosure, there is a solid-state imaging element including: a substrate; a plurality of photoelectric conversion units that is provided in the substrate; a second insulation film that is provided between the plurality of photoelectric conversion units adjacent to each other among the plurality of photoelectric conversion units and provided in a trench penetrating between a first surface of the substrate and a second surface opposite to the first surface; a third insulation film that is provided on the first surface of the substrate and provided on both sides of the trench or along the trench when viewed from the first surface, the third insulation film being wider than the second insulation film; and an impurity diffusion layer that is provided on the first surface of the substrate and in contact with a side surface of the third insulation film, in which the second insulation film is not exposed from the side surface of the third insulation film.

An interface between the second insulation film and the third insulation film is in the third insulation film.

An interface between the second insulation film and the third insulation film is in the trench.

The second insulation film is a stacked film including a plurality of partial films.

The plurality of partial films is any of a fixed charge film, a low refractive index film, an oxide film, and a metal film.

There is a cavity in the second insulation film.

The solid-state imaging element further includes: a wiring layer that is provided on the first surface of the substrate and electrically connected to the impurity diffusion layer; and a lens that is provided on the second surface of the substrate.

According to still another aspect of the present disclosure, there is a manufacturing method of a solid-state imaging element, the method including: forming a plurality of photoelectric conversion units in a substrate; forming, between the photoelectric conversion units adjacent to each other among the plurality of photoelectric conversion units, a trench extending from a first surface of the substrate to a second surface opposite to the first surface; forming a sacrificial film in the trench; forming a third insulation film on the first surface of the substrate, the third insulation film being wider than the trench on both sides of the trench or along the trench when viewed from the first surface; removing the sacrificial film in the trench from the second surface side of the substrate; and forming a second insulation film in the trench from the second surface side of the substrate.

The method further includes removing an upper portion of the third insulation film such that the trench does not extend to a side surface of the third insulation film when the sacrificial film is removed, in which the second insulation film is formed so as not to be exposed from the side surface of the third insulation film when the second insulation film is formed.

The method further includes: partially removing the sacrificial film from the first surface side of the substrate to lower an upper surface of the sacrificial film below the first surface after the sacrificial film is formed; lowering the upper surface of the sacrificial film into the trench below a bottom surface of the third insulation film when the third insulation film is formed; and removing the sacrificial film from the second surface side of the substrate to form a second insulation film from a second surface side of the substrate into the trench.

BRIEF DESCRIPTION OF DRAWINGS

FIG. 1 is a block diagram illustrating a configuration example of an imaging apparatus which is an example of an electronic apparatus of the present disclosure.

FIG. 6 is a plan view illustrating an example of a layout of pixels as viewed from a second surface.

MODE FOR CARRYING OUT THE INVENTION

Figure 2:
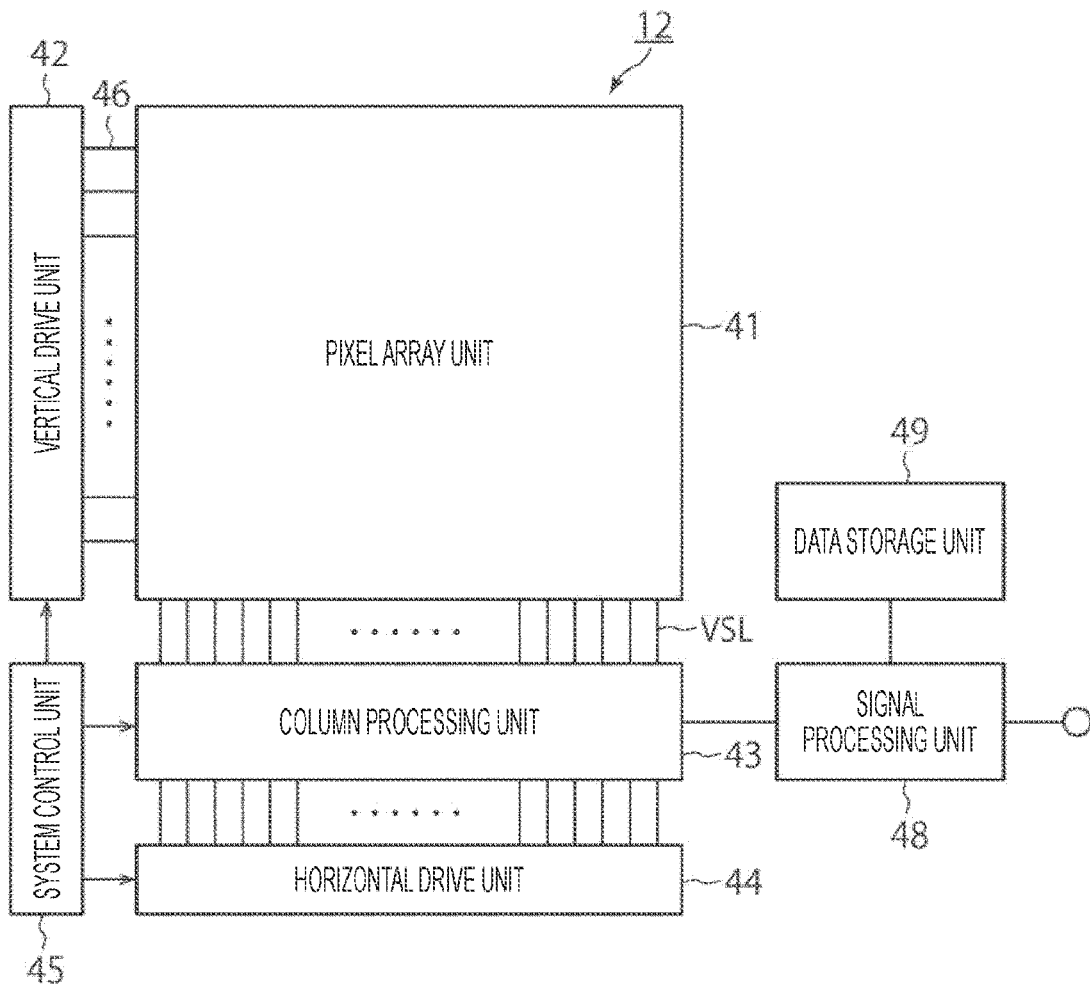
FIG. 2 is a block diagram illustrating a configuration example of an imaging element.

Hereinafter, specific embodiments to which the present technology is applied will be described in detail with reference to the drawings. The drawings are schematic or conceptual, and the ratio of each portion are not necessarily the same as actual ones. In the specification and the drawings, the elements similar to those described above with respect to the previously described drawings are denoted by the same reference numerals, and the detailed description thereof will be appropriately omitted.

First Embodiment

Figure 1:
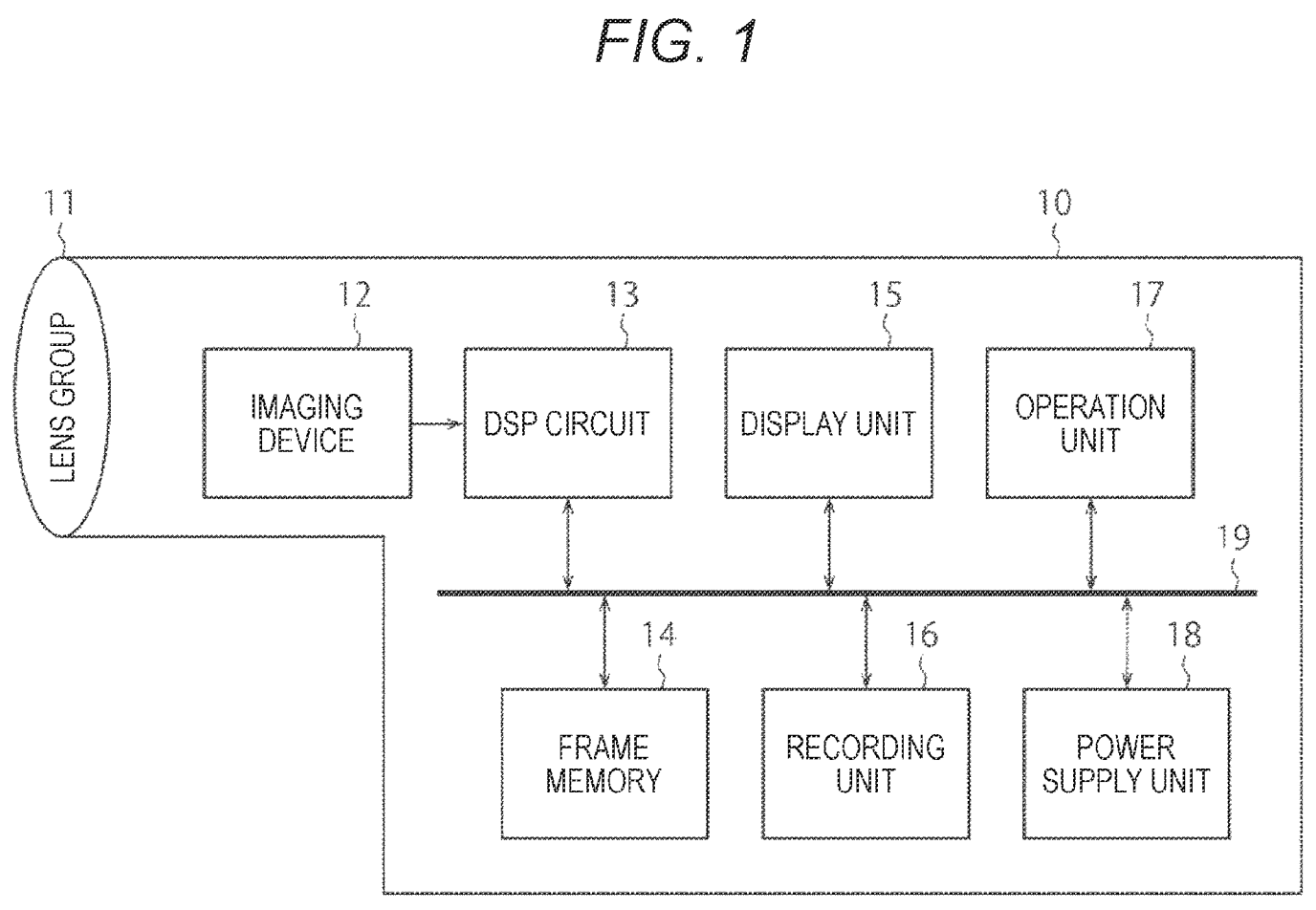

FIG. 1 is a block diagram illustrating a configuration example of an imaging apparatus which is an example of an electronic apparatus of the present disclosure. As illustrated in FIG. 1, an imaging apparatus 10 includes an optical system including a lens group 11, an imaging element 12, a DSP circuit 13 which is a camera signal processing unit, a frame memory 14, a display unit 15, a recording unit 16, an operation system 17, and a power supply system 18. The DSP circuit 13, the frame memory 14, the display unit 15, the recording unit 16, the operation system 17, and the power supply system 18 are connected to each other via a bus line 19. A CPU 20 controls each unit in the imaging apparatus 10.

The lens group 11 receives incident light (image light) from a subject and forms an image on an imaging surface of the imaging element 12. The imaging element 12 converts the light amount of the incident light captured on the imaging surface by the lens group 11 into an electrical signal for each pixel and outputs the electrical signal as a pixel signal. As the imaging element 12, an imaging element (image sensor) including pixels to be described below can be used.

An example of the display unit 15 includes a panel-type display unit such as a liquid crystal display unit or an organic electro luminescence (EL) display unit, and the display unit 15 displays a moving image or a still image, which is captured by the imaging element 12. The recording unit 16 records the moving image or the still image, which is captured by the imaging element 12, on a recording medium such as a hard disk drive (HDD) or a solid state drive (SSD).

The operation system 17 issues operation commands for various functions of the imaging apparatus through the user's operation. The power supply system 18 appropriately supplies various power sources serving as operational power sources for the DSP circuit 13, the frame memory 14, the display unit 15, the recording unit 16, and the operation system 17 to these supply targets.

FIG. 2 is a block diagram illustrating a configuration example of the imaging element 12. Here, the imaging element 12 may be a complementary metal oxide semiconductor (CMOS) image sensor which images a subject to obtain a captured image as an electrical signal. The imaging element 12 includes a pixel array unit 41, a vertical drive unit 42, a column processing unit 43, a horizontal drive unit 44, and a system control unit 45. The pixel array unit 41, the vertical drive unit 42, the column processing unit 43, the horizontal drive unit 44, and the system control unit 45 are formed on a semiconductor substrate (chip) (not illustrated).

In the pixel array unit 41, unit pixels each having a photoelectric conversion element that generates a photoelectric charge having a charge amount according to an incident light amount and accumulates the photoelectric charge therein are two-dimensionally arranged in a matrix form. Note that, in the following description, the photoelectric charge having a charge amount according to an incident light amount may be simply described as "charge", and a unit pixel may be simply described as "pixel".

In the pixel array unit 41, a pixel drive line 46 is further formed for each row in a horizontal direction (array direction of the pixels in a pixel row) in the drawing with respect to the pixel array in the matrix form, and a vertical signal line VSL as a first signal line is formed for each column in a vertical direction (array direction of the pixels in the pixel column) in the drawing. One end of the pixel drive line 46 is connected to an output terminal corresponding to each row of the vertical drive unit 42.

The imaging element 12 further includes a signal processing unit 48 and a data storage unit 49. The signal processing unit 48 and the data storage unit 49 may be an external signal processing unit provided on a substrate separate from the imaging element 12, for example, a digital signal processor (DSP) or processing with software, or may be mounted on the same substrate as that of the imaging element 12.

The vertical drive unit 42 includes a shift register and an address decoder, and is a pixel drive unit that drives pixels of the pixel array unit 41 at the same time for all pixels or in units of rows. Although a specific configuration of the vertical drive unit 42 is not illustrated, the vertical drive unit 42 includes a read scanning system and a sweep scanning system, or performs batch sweeping and batch transfer.

In order to read a pixel signal from the unit pixel, the read scanning system sequentially selectively scans the unit pixels of the pixel array unit 41 row by row. In the case of row driving (rolling shutter operation), with respect to the sweeping, the sweep scanning is performed on a row on which read scanning is performed by the read scanning system earlier than the read scanning by a time corresponding to a shutter speed. Furthermore, in the case of global exposure (global shutter operation), the batch sweeping is performed earlier than the batch transfer by a time corresponding to the shutter speed.

When this sweeping is performed, unnecessary charges are swept (reset) from the photoelectric conversion elements of the unit pixels in the read row. When the unnecessary charges are swept (reset), a so-called electronic shutter operation is performed. Here, the electronic shutter operation refers to an operation of sweeping the photoelectric charge of the photoelectric conversion element and newly starting exposure (starting accumulation of the photoelectric charge).

The signal read by the read operation of the read scanning system corresponds to the amount of light incident after the immediately preceding read operation or electronic shutter operation. In the case of the row driving, a period from the read timing of the immediately preceding read operation or the sweep timing of the electronic shutter operation to the read timing of the current read operation is an accumulation period (exposure period) of the photoelectric charge in the unit pixel. In the case of the global exposure, a period from the batch sweeping to the batch transfer is an accumulation period (exposure period).

The pixel signal output from each unit pixel of the pixel row selectively scanned by the vertical drive unit 42 is supplied to the column processing unit 43 through each of the vertical signal lines VSL. The column processing unit 43 performs predetermined signal processing on the pixel signal output from each unit pixel of the selected row through the vertical signal line VSL for each pixel column of the pixel array unit 41, and temporarily holds the pixel signal after the signal processing.

Specifically, the column processing unit 43 or the signal processing unit 48 performs at least noise removal processing, for example, correlated double sampling (CDS) processing as signal processing. When the correlated double sampling is performed by the column processing unit 43, fixed pattern noise unique to the pixel, such as reset noise and threshold variation of the amplification transistor, is removed. Note that the column processing unit 43 can have, for example, an analog-digital (AD) conversion function in addition to the noise removal processing, and can output a signal level as a digital signal.

The horizontal drive unit 44 includes a shift register and an address decoder, and sequentially selects unit circuits corresponding to pixel columns of the column processing unit 43. When the selective scanning is performed by the horizontal drive unit 44, the pixel signals subjected to the signal processing by the column processing unit 43 are sequentially output to the signal processing unit 48.

The system control unit 45 includes a timing generator that generates various timing signals, and performs drive control for the vertical drive unit 42, the column processing unit 43, the horizontal drive unit 44, and the like on the basis of the various timing signals generated by the timing generator.

The signal processing unit 48 has at least an addition processing function, and performs various signal processing such as addition processing on the pixel signal output from the column processing unit 43. The data storage unit 49 temporarily stores data necessary for signal processing when the signal processing is performed by the signal processing unit 48.

Figure 3:
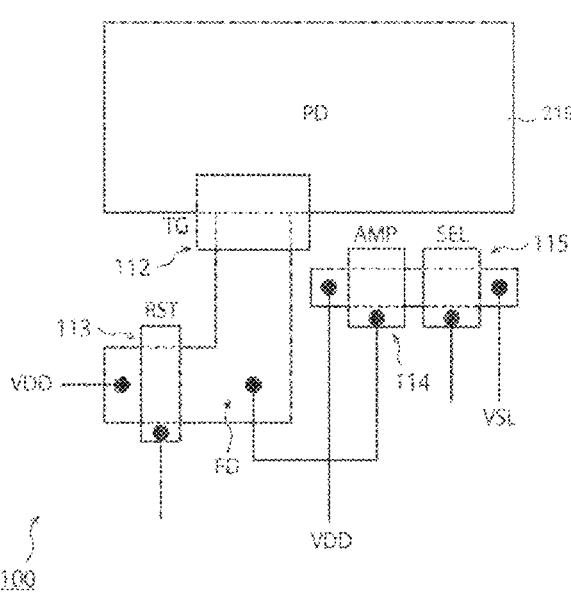
FIG. 3 is a plan view illustrating a configuration example of one pixel among a plurality of pixels constituting a pixel array unit.
Figure 4:
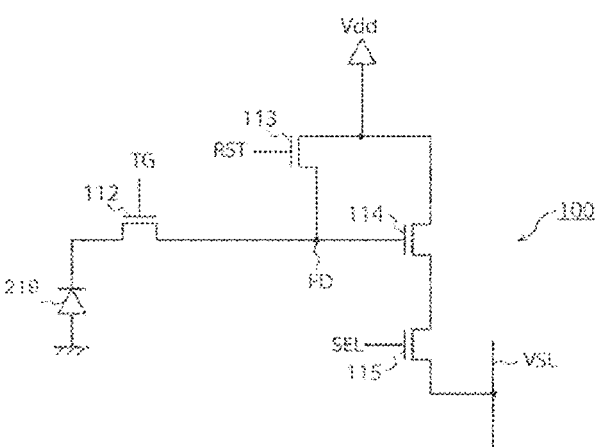
FIG. 4 is an equivalent circuit diagram illustrating a configuration example of a pixel.

FIG. 3 is a plan view illustrating a configuration example of one pixel 100 among a plurality of pixels constituting the pixel array unit 41. FIG. 4 is an equivalent circuit diagram illustrating a configuration example of the pixel 100. The pixel array unit 41 includes, for example, a plurality of pixels 100 arranged in a two-dimensional array form. Each of the pixels 100 photoelectrically converts incident light and outputs a pixel signal of a captured image.

The pixel 100 includes a photodiode (PD) 219, a transfer transistor (TG) 112, a reset transistor (RST) 113, an amplification transistor (AMP) 114, and a selection transistor (SEL) 115. Note that, in a region other than the transistor and the photodiode 219, for example, an element isolation region is provided to be electrically isolated from other pixels. The element isolation region includes an insulation film. In the case of electronic reading, the element isolation region may be formed by a p-type region. The transistors 112 to 115 may be n-type transistors or p-type transistors. Here, the transistors 112 to 115 will be described as an n-type transistor.

The photodiode 219 photoelectrically converts received light into a charge (here, an electron) corresponding to the received light amount, and accumulates the charge. An anode of the photodiode 219 is connected to a ground of the pixel region, and a cathode is connected to a floating diffusion FD as a floating diffusion region via the transfer transistor 112. Note that the cathode of the photodiode 219 may be connected to a power supply (pixel power supply) of the pixel region, and the anode may be connected to the floating diffusion FD via the transfer transistor 112. In this case, the pixel 100 reads the charge as a hole.

The transfer transistor 112 controls reading for the photoelectric charge from the photodiode 219. A source as one end of the transfer transistor 112 is connected to the cathode of the photodiode 219. A drain as the other end of the transfer transistor 112 is connected to the floating diffusion FD. Furthermore, a transfer control signal is supplied to a gate of the transfer transistor 112. The reading for the charge from the photodiode 219 is controlled with this transfer control signal. For example, in a case where the transfer control signal (that is, the gate potential of the transfer transistor 112) is at a low level, the transfer transistor 112 is turned off (in a non-conductive state), and no charge is transferred from the photodiode 219. In a case where the transfer control signal (that is, the gate potential of the transfer transistor 112) is at a high level, the transfer transistor 112 is turned on (in a conductive state), and transfers the charge accumulated in the photodiode 219 to the floating diffusion FD. The floating diffusion FD is a diffusion layer capable of temporarily accumulating the charge, and is provided in a surface region of the semiconductor substrate 218.

The reset transistor 113 resets the charge in the pixel 100. The reset operation is, for example, an operation of expelling the charges (for example, electrons) of the photodiode 219 and floating diffusion FD to a power supply VDD, or an operation of expelling holes to the ground. A drain of the reset transistor 113 is connected to the power supply VDD, and a source of the reset transistor 113 is connected to the floating diffusion FD and is connected to a drain of the transfer transistor 112 via the floating diffusion FD. That is, the reset transistor 113 is connected between the drain of the transfer transistor 112 and the power supply VDD. Furthermore, a reset control signal is supplied to a gate of the reset transistor 113. The resetting of the charge in the pixel 100 is controlled with this reset control signal. For example, in a case where the reset control signal (that is, the gate potential of the reset transistor 113) is at a low level, the reset transistor 113 is turned off and the resetting is not performed. In a case where the reset control signal (that is, the gate potential of the reset transistor 113) is at a high level, the reset transistor 113 is turned on, expels the charge in the pixel 100 to the power supply VDD, and resets the floating diffusion FD and the photodiode 219.

The amplification transistor 114 is in a conductive state according to the voltage of the floating diffusion FD. The amplification transistor 114 amplifies voltage change in the floating diffusion FD and outputs the voltage change as an electrical signal (analog signal) to the vertical signal line VSL via the selection transistor 115. That is, the amplification transistor 114 functions as a read circuit that reads the voltage of the floating diffusion FD. A gate of the amplification transistor 114 is connected to the floating diffusion FD. A drain of the amplification transistor 114 is connected to a source-follower power supply voltage (VDD), and a source of the amplification transistor 114 is connected to a drain of the selection transistor 115. That is, the amplification transistor 114 is connected between the power supply (VDD) and the vertical signal line VSL. For example, the amplification transistor 114 outputs, to the selection transistor 115, a voltage at a reset level (P-phase) corresponding to the potential of the floating diffusion FD in the reset state. Furthermore, the amplification transistor 114 outputs, to the selection transistor 115, a voltage at a data level (D-phase) corresponding to the potential of the floating diffusion FD in which the signal charge from the photodiode 219 is accumulated.

The selection transistor 115 controls output of the electrical signal from the amplification transistor 114 to the vertical signal line VSL. A gate of the selection transistor 115 is connected to the pixel drive line 46 in FIG. 2, and receives a selection control signal. The drain of the selection transistor 115 is connected to a source of the amplification transistor 114, and a source of the selection transistor 115 is connected to the vertical signal line VSL as the first signal line. That is, the selection transistor 115 is connected between the amplification transistor 114 and the vertical signal line VSL. The amplification transistor 114 and the selection transistor 115 are connected in series between the power supply VDD and the vertical signal line VSL. Furthermore, the selection transistor 115 controls the output of the electrical signal from the amplification transistor 114 to the vertical signal line VSL on the basis of the selection control signal. For example, in a case where the pixel 100 is not selected, the selection control signal (that is, the gate potential of the selection transistor 115) is at a low level. In this case, the selection transistor 115 is turned off, and does not output the electrical signal at the reset level or at the data level from the amplification transistor 114 to the vertical signal line VSL. In a case where the pixel 100 is selected, the selection control signal (that is, the gate potential of the selection transistor 115) is at a high level. In this case, the selection transistor 115 is turned on, electrically connects the amplification transistor 114 to the vertical signal line VSL, and outputs the electrical signal corresponding to the voltage of the floating diffusion FD to the vertical signal line VSL. The vertical signal line VSL is connected to an A/D conversion circuit outside the pixel 100, and transfers the electrical signal to the A/D conversion circuit. The A/D conversion circuit performs AD conversion on the electrical signal at the reset level and the electrical signal at the data level. The column processing unit 43 or the signal processing unit performs CDS processing on the electrical signal converted into the digital signal.

As described above, each pixel 100 can output, to the vertical signal line VSL, the electrical signal corresponding to incident light.

Next, the structure of the pixel 100 will be described.

Figure 5:
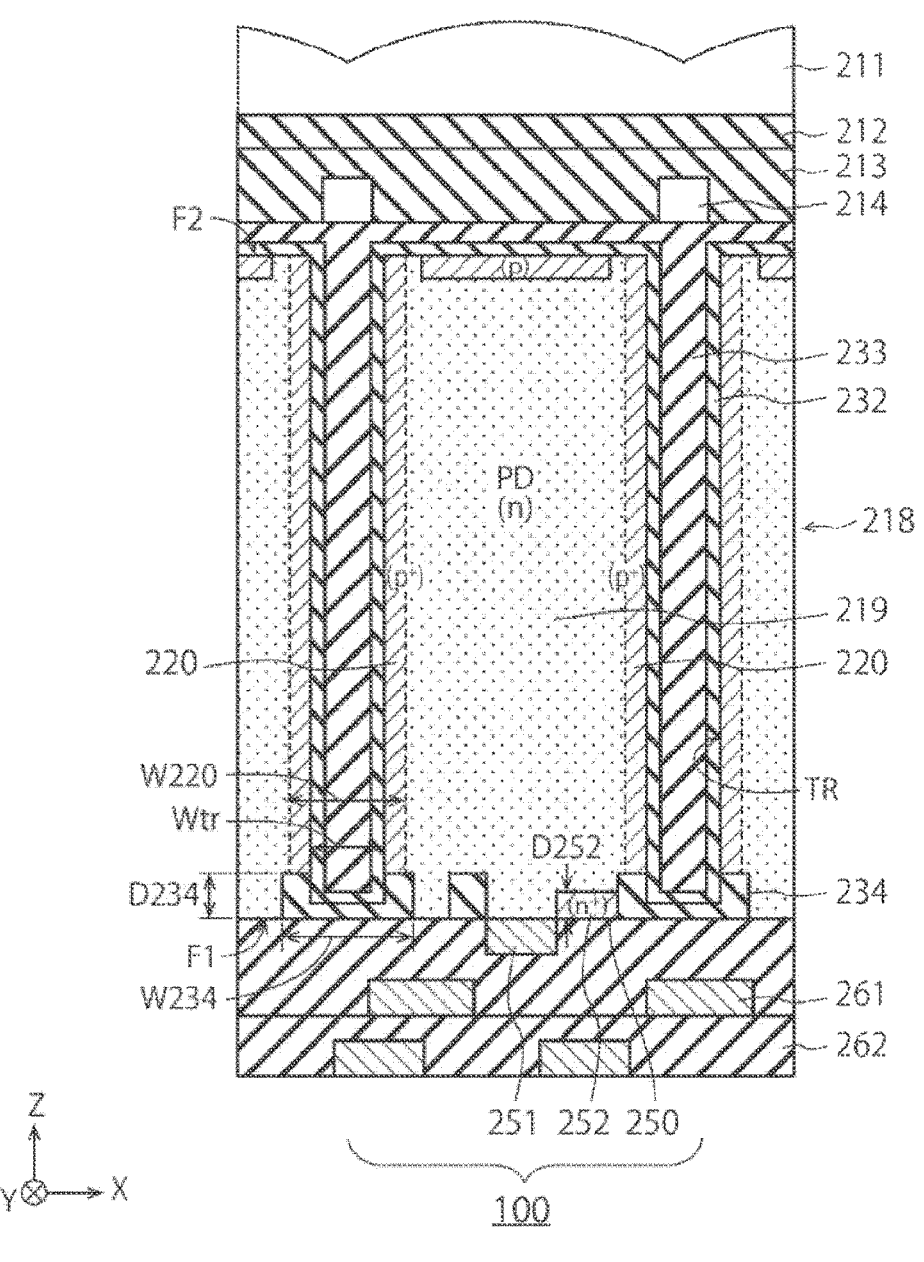
FIG. 5 is a cross-sectional view illustrating a configuration example of a pixel according to the present embodiment.
Figure 6:
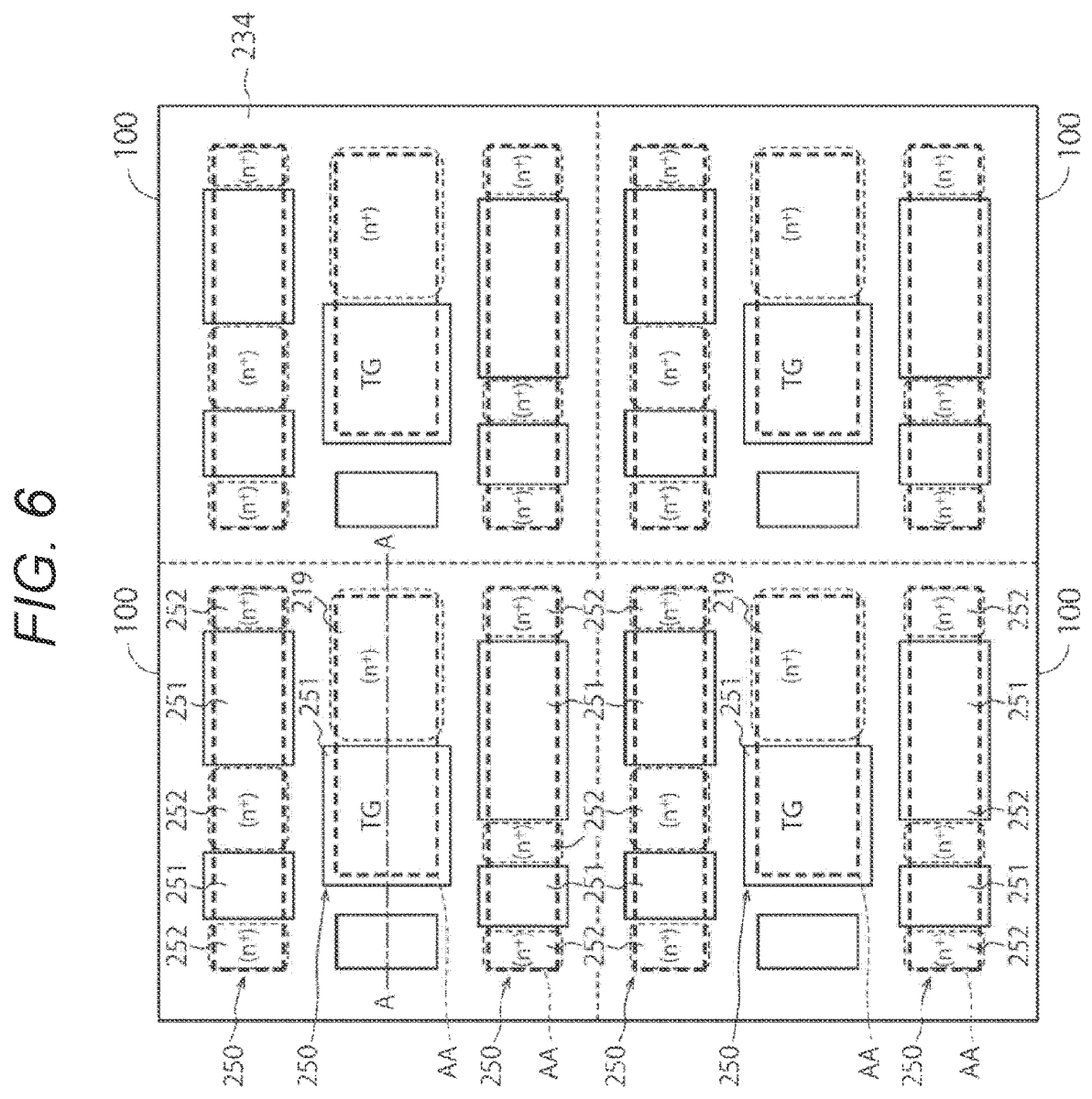

FIG. 5 is a cross-sectional view illustrating a configuration example of the pixel 100 according to the present embodiment. FIG. 6 is a plan view illustrating an example of a layout of the pixels 100 as viewed from a second surface F2. FIG. 5 corresponds to a cross section taken along line A-A of FIG. 6.

As illustrated in FIG. 5, the pixel 100 includes a semiconductor substrate 218, a photodiode (PD) 219, a charge induction layer 220, a fixed charge film 232, a pixel isolation film 233, an element isolation film 234, a light shielding film 214, a planarization film 213, a color filter 212, an on-chip lens (OCL) 211, a transistor 250, a wiring 261, and an interlayer insulation film 262. Note that the pixel 100 may not include the color filter 212 and the on-chip lens (OCL) 211.

The semiconductor substrate 218 is, for example, a silicon substrate. The semiconductor substrate 218 has a first surface F1 and a second surface F2 opposite to the first surface F1. The semiconductor substrate 218 is provided with, for example, the photodiode 219 including an n-type semiconductor region and a p-type semiconductor region. The photodiode 219 is a photoelectric conversion unit that converts incident light having passed through the on-chip lens 211 or the like on the second surface F2 into a charge (for example, an electron). The photodiode 219 also functions as a charge accumulation region that accumulates photoelectrically converted charge in the n-type semiconductor region. The photodiode 219 is isolated for each pixel 100 by using the fixed charge film 232 and the pixel isolation film 233, and performs photoelectric conversion for each pixel 100. The photodiode 219 includes the p-type semiconductor region on the second surface F2 side of the semiconductor substrate 218.

As illustrated in FIG. 6, the fixed charge film 232 and the pixel isolation film 233 are interposed between a plurality of adjacent pixels 100 and are provided in a lattice shape when viewed from a direction (Z direction) substantially perpendicular to the first surface F1 or the second surface F2. The fixed charge film 232 and the pixel isolation film 233 are provided between a plurality of photoelectric conversion units adjacent to each other. The fixed charge film 232 and the pixel isolation film 233 partition the photodiode 219 for each pixel 100, and electrically and optically isolate the photodiode 219 of each pixel 100. Note that the pixel array unit 41 in FIG. 2 is configured by repeatedly arranging the pixels 100 in FIG. 6 in four directions.

The fixed charge film 232 as a first insulation film is provided in a trench TR penetrating between the first surface F1 and second surface of the semiconductor substrate 218, and covers the inner wall of the trench TR. The trench TR are provided between a plurality of adjacent pixels 100 and partitions the pixel 100 in a lattice shape when viewed in a direction substantially perpendicular to the first surface F1 or the second surface F2 (refer to FIG. 6). Accordingly, the fixed charge film 232 is provided along the trench TR, and is provided between the adjacent pixels 100 similarly to the trench TR.

The fixed charge film 232 is an insulation film having a fixed charge, and has, for example, a negative charge. As the fixed charge film 232, a material, which is deposited on the semiconductor substrate 218 and capable of generating the fixed charge and enhancing pinning, is preferable. Since the fixed charge film 232 is provided on the inner wall of the trench TR, the charge (for example, positive charge) is induced in the charge induction layer 220 on the surface of the semiconductor substrate 218 adjacent to the fixed charge film 232.

For the fixed charge film 232, for example, a high refractive index material film or a high dielectric film, which has a negative charge, may be used. For example, a metal oxide or metal nitride containing at least one element of hafnium (Hf), aluminum (Al), zirconium (Zr), tantalum (Ta), or titanium (Ti) may be used for the fixed charge film 232. Furthermore, for the fixed charge film 232, an oxide or nitride containing at least one element of lanthanum (La), praseodymium (Pr), cerium (Ce), neodymium (Nd), promethium (Pm), samarium (Sm), europium (Eu), gadolinium (Gd), terbium (Tb), dysprosium (Dy), holmium (Ho), thulium (Tm), ytterbium (Yb), lutetium (Lu), or yttrium (Y) may be used. Moreover, a hafnium oxynitride film or an aluminum oxynitride film may be used for the fixed charge film 232.

As the material of the fixed charge film 232, silicon (Si) or nitrogen (N) may be added to the film as long as insulation properties are not impaired. The concentration thereof is appropriately determined within a range in which the insulation properties of the film are not impaired. As described above, the addition of silicon (Si) or nitrogen (N) makes it possible to increase the heat resistance of the film and the ability to prevent ion implantation in the process.

The fixed charge film 232 having a negative charge is provided on the inner wall of the trench TR and the second surface F2 of the semiconductor substrate 218. Therefore, an inversion layer (p-type charge induction layer) is formed on the inner wall of the trench TR in contact with the fixed charge film 232 and the second surface F2 of the semiconductor substrate 218. Since a silicon interface is pinned by the charge induction layer, generation of a dark current is suppressed. Furthermore, when the trench TR is formed, physical damage may occur on the inner wall of the trench TR, and pinning deviation may occur in a peripheral portion of the trench TR. On the other hand, in the present embodiment, the fixed charge film 232 having a fixed charge is provided on the inner wall of the trench TR, and thus the pinning deviation can be suppressed.

Note that, as a forming method of the fixed charge film 232, for example, a chemical vapor deposition (CVD) method, a sputtering method, an atomic layer deposition (ALD) method, or the like may be used.

In the trench TR, the pixel isolation film 233 as a second insulation film is provided so as to fill the trench TR on an inner side of the fixed charge film 232. The pixel isolation film 233 is provided along the trench TR, and is provided between the adjacent pixels 100 similarly to the trench TR. The pixel isolation film 233 fills the trench TR to electrically and optically isolate the adjacent pixels 100 from each other. For the pixel isolation film 233, for example, a material having a refractive index different from that of the fixed charge film 232 is preferably used, and for example, silicon oxide, silicon nitride, silicon oxynitride, resin, or the like can be used. Furthermore, for the pixel isolation film 233, for example, a material that does not have a positive fixed charge or has a small amount of the positive fixed charge may be used.

Since a material having high insulation properties and high light shielding properties for the pixel isolation film 233 is used, incident light and a signal charge hardly leak into adjacent pixels. Therefore, the leakage (crosstalk) of incident light between the pixels 100 can be suppressed. Furthermore, even when the signal charge exceeding the saturation charge amount (Qs) is generated, it is possible to prevent the signal charge from leaking to adjacent pixels.

The charge induction layer 220 is, for example, a p-type high-concentration charge layer, and is a positive charge layer induced by a fixed charge (for example, negative charge) of the fixed charge film 232. The charge induction layer 220 may be a p-type impurity diffusion layer formed by introducing a p-type impurity. Alternatively, the charge induction layer 220 may be induced by the fixed charge film 232, and the p-type impurity may not necessarily be introduced (refer to a second embodiment).

The element isolation film 234 as a third insulation film covers the end of the fixed charge film 232 and the end of the pixel isolation film 233 on the first surface F1 side. The element isolation film 234 is provided on the first surface F1 of the semiconductor substrate 218 to define an active area A-A for forming the transistor 250 as illustrated in FIG. 6, and electrically isolates the active areas A-A from each other. When viewed in a direction substantially perpendicular to the first surface F1 (in a Z direction), as illustrated in FIG. 6, the element isolation film 234 is provided between the adjacent pixels 100, and overlaps the fixed charge film 232 and the pixel isolation film 233. Accordingly, as illustrated in FIG. 6, the element isolation film 234 appears on the first surface F1, and the fixed charge film 232 and the pixel isolation film 233 are under the element isolation film 234 and do not appear on the first surface F1. According to the present embodiment, since the element isolation film 234 covers the end of the fixed charge film 232 and the end of the pixel isolation film 233, the element isolation film 234 isolates the charge induction layer 220 from the source or drain of the transistor 250 by being interposed between the charge induction layer 220 and the source or drain of the transistor 250. Therefore, it is possible to suppress formation of a pn junction between the charge induction layer 220 having a high concentration of P⁺ charge and the source or drain diffusion layer 252 having a high concentration of N⁺ charge in the pixel 100.

The transistor 250 is provided on the first surface F1 of the semiconductor substrate 218, and includes a gate 251, and the source and drain diffusion layers (hereinafter, also simply referred to as a diffusion layer) 252. The diffusion layer 252 is a high-concentration impurity diffusion layer having an n⁺-type impurity of a conductivity type opposite to that of the charge induction layer 220.

The transistor 250 is at least one of the transistors constituting the pixel 100 illustrated in FIG. 3, and may be any of the transfer transistor 112, the reset transistor 113, the amplification transistor 114, and the selection transistor 115.

The interlayer insulation film 262 and the wiring 261 are provided on the first surface F1. The transistor 250 is covered by the interlayer insulation film 262. The wiring 261 is electrically connected to any one of the transfer transistor 112, the reset transistor 113, the amplification transistor 114, and the selection transistor 115, and reads a signal voltage corresponding to the signal charge from the selection transistor 115 to the vertical signal line VSL.

On the other hand, the fixed charge film 232 and the pixel isolation film 233 are provided on the second surface F2 of the semiconductor substrate 218, and the light shielding film 214 is further provided on the fixed charge film 232 and the pixel isolation film 233. The light shielding film 214 is provided along the trench TR so as to overlap the trench TR when viewed from above the second surface F2 (that is, Z direction). The light shielding film 214 includes a metal material having high light shielding properties. For example, a single metal material such as tungsten or aluminum, a stacked film of aluminum and a barrier metal (for example, titanium, cobalt, and the like), a stacked film of tungsten and a barrier metal (for example, titanium, cobalt, and the like), a stacked film of aluminum and cobalt, or the like can be used for the light shielding film 214. The light shielding film 214 can prevent incident light from entering the through trench TR and reduce random noise in the pixel 100.

The planarization film 213 is provided on the second surface F2 and covers the light shielding film 214. The surface of the planarization film 213 is planarized to provide a flat surface for the color filter 212. As the planarization film 213, for example, an insulation film such as a silicon oxide film is used. The planarization film 213 and the color filter 212 include a light transmitting material.

The color filter 212 is provided on the planarization film 213. For example, a resin or the like that transmits light of a specific color such as RGB is used as the color filter 212.

The on-chip lens 211 is provided on the color filter 212 and condenses incident light on the photodiode 219 of the pixel 100.

The incident light is incident on the photodiode 219 of the pixel 100 from the second surface F2. The solid-state imaging element according to the present embodiment is a back-side illumination complementary metal oxide semiconductor (CMOS) image sensor (CIS) for capturing light from the second surface (back surface) F2 side opposite to the first surface (front surface) F1 on which the transistor 250 and the wiring 261 are provided. However, the present technology may be applied to a front-side illumination CIS.

The incident light enters the photodiode 219 via the on-chip lens 211, the color filter 212, and the planarization film 213, and is photoelectrically converted in the photodiode 219.

The anode of the photodiode 219 is grounded, the positive charge (hole) is expelled to the ground, and the negative charge (electron) is accumulated in the photodiode 219. The electron accumulated in the photodiode 219 is read via the transfer transistor or the like and output to the vertical signal line VSL of FIG. 3 as an electrical signal.

As described above, according to the present embodiment, the element isolation film 234 is provided along both sides of the trench TR when viewed in a direction substantially perpendicular to the first surface F1. Furthermore, the element isolation film 234 is provided on the trench TR so as to overlap the trench TR when viewed in a direction substantially perpendicular to the first surface F1. Therefore, it is possible to suppress formation of a pn junction between the charge induction layer 220 having a high concentration of $P^+$ charge and the diffusion layer 252 having a high concentration of $N^+$ charge in the pixel 100.

In a case where the element isolation film 234 does not cover the end of the trench TR, the end of the fixed charge film 232, and the end of the pixel isolation film 233, the charge induction layer 220 in FIG. 5 is formed up to the first surface F1. In this case, the charge induction layer 220 and the diffusion layer 252 form a high-concentration pn junction formed by a high-concentration $p^+$ charge layer and a high-concentration $n^+$ diffusion layer. In a case where there is a high concentration pn junction, a high electric field is generated in the high concentration pn junction, which causes a dark current. The dark current causes random noise of the pixel 100, and the effect of suppressing the dark current with pinning of the fixed charge film 232 is weakened.

On the other hand, in the present embodiment, the element isolation film 234 covers the end of the fixed charge film 232 and the end of the pixel isolation film 233 along the through trench TR. The element isolation film 234 insulates and isolates the charge induction layer 220 from the source and drain diffusion layers 252 of the transistor 250. This suppresses formation of the high-concentration pn junction and suppresses generation of the high electric field. As a result, the dark current is suppressed, and the random noise in the pixel 100 can be reduced.

Next, the size of the element isolation film 234 will be described in more detail with reference to FIG. 5.

The element isolation film 234 is provided so as to overlap the trench TR on both sides of the trench TR and along the trench TR when the semiconductor substrate 218 is viewed in a direction perpendicular to the first surface F1 (that is, in a Z direction). Furthermore, a width W234 of the element isolation film 234 is greater than a width Wtr of the trench TR. The width Wtr of the trench TR is equal to or greater than the width of the fixed charge film 232 or the width of the pixel isolation film 233. Accordingly, the width W234 is greater than any of the width of the trench TR, the width of the fixed charge film 232, and the width of the pixel isolation film 233. Note that, as illustrated in FIG. 5, the width W234 and the width Wtr are widths in a cross section in a direction substantially perpendicular to an extending direction (that is, X direction) of the trench TR, fixed charge film 232, and pixel isolation film 233 on the first surface F1. Moreover, as illustrated in FIG. 5, the element isolation film 234 protrudes toward the photodiode 219 side (that is, ±X direction) as compared with the charge induction layer 220. Accordingly, the width W234 of the element isolation film 234 is greater than a width W220 formed by one trench TR and two charge induction layers 220 on both sides of the trench TR. Therefore, the charge induction layer 220 is prevented from being formed (induced) on the side surfaces of the element isolation film 234, and the element isolation film 234 can more reliably isolate the charge induction layer 220 from the diffusion layer 252.

Furthermore, a depth (thickness) D234 of the element isolation film 234 in a Z direction is deeper (thicker) than a depth (thickness) D252 of the diffusion layer 252. Therefore, the element isolation film 234 can more reliably isolate the charge induction layer 220 from the diffusion layer 252.

Next, a manufacturing method of the solid-state imaging element of the present embodiment will be described.

FIGS. 7 to 13 are cross-sectional views illustrating an example of the manufacturing method of the solid-state imaging element according to the first embodiment.

(Front End Step)

A processing step from the first surface F1 of the semiconductor substrate 218 is performed.

First, the element isolation film 234 is formed on the first surface F1 side of the semiconductor substrate 218. The element isolation film 234 is formed to define the active area A-A as shallow trench isolation (STI). Furthermore, in the present embodiment, the element isolation film 234 is formed in a formation region of the trench TR between the adjacent pixels 100. The element isolation film 234 removes the upper portion of the semiconductor substrate 218 in the element isolation region by using a lithography technology and an etching technology. Thereafter, an insulation film such as a silicon oxide film is embedded in the element isolation region to form the element isolation film 234. The element isolation film 234 is formed to be wider than the trench TR and charge induction layer 220 described above.

Next, a trench TR is formed between the adjacent pixels 100 by using the lithography technology and an etching technology. The trench TR is formed in the semiconductor substrate 218 from the first surface F1 toward the second surface F2 of the semiconductor substrate 218. At this time, the trench TR may penetrate the semiconductor substrate 218, but may not penetrate the semiconductor substrate 218 at this stage. In this case, the second surface F2 of the semiconductor substrate 218 may be polished in a rear end step, and the trench TR may penetrate the semiconductor substrate 218.

Next, a p-type impurity is ion-implanted in an inclined direction toward the inner wall of the trench TR. Alternatively, the p-type impurity may be introduced into the inner wall of the trench TR by using a plasma doping method. Moreover, a p-type impurity may be introduced into the inner wall of the trench TR by using a solid-phase diffusion method. Accordingly, a p-type diffusion layer is formed as the charge induction layer 220 on the side wall of the trench TR.

Figure 7:
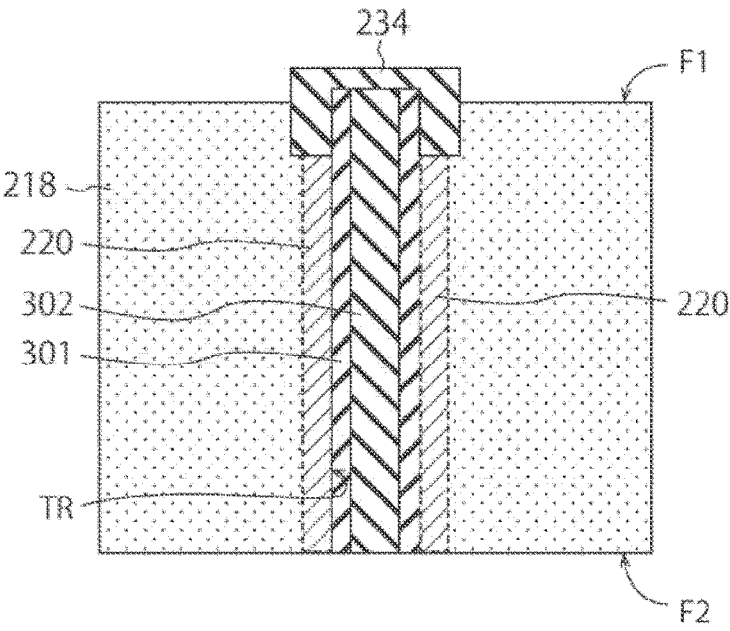
FIG. 7 is a cross-sectional view illustrating an example of a manufacturing method of a solid-state imaging element according to a first embodiment.

Next, an insulation film 301 such as a silicon oxide film is deposited on the inner wall of the trench TR, and then the inside of the trench TR is filled with a sacrificial film 302 such as polysilicon. The sacrificial film 302 is a material that can be selectively etched with respect to the insulation film 301. The trench TR also penetrates the central portion of the element isolation film 234. Therefore, after the formation of the trench TR, the insulation film 301, and the sacrificial film 302, the trench TR portion of the element isolation film 234 is backfilled with the silicon oxide film. Accordingly, the structure illustrated in FIG. 7 is obtained. Note that the element isolation film 234 may be formed after the formation of the trench TR, the insulation film 301, and the sacrificial film 302. In this case, it is not necessary to backfill the trench TR portion of the element isolation film 234 with the silicon oxide film.

Figure 8:
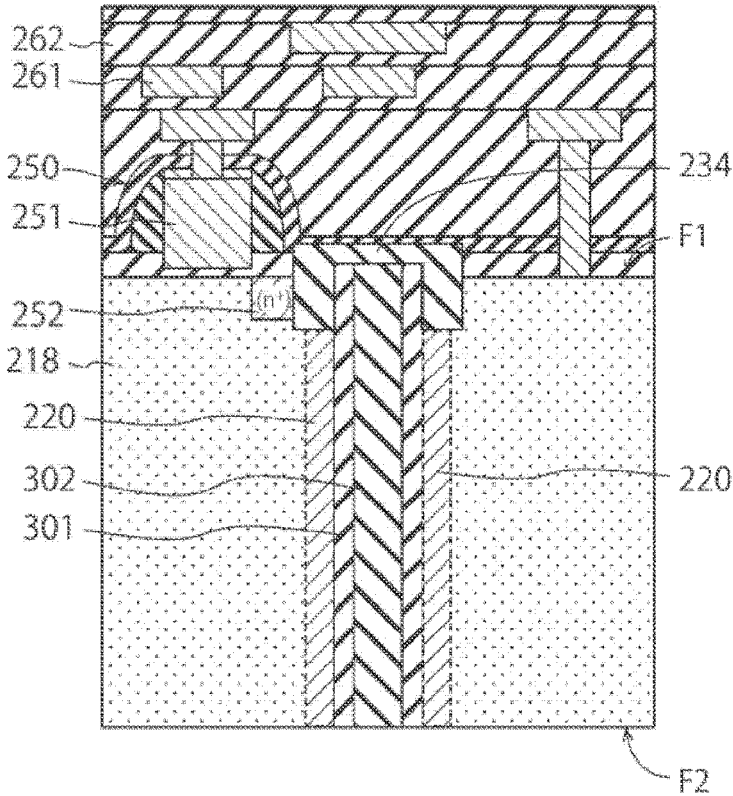
FIG. 8 is a cross-sectional view illustrating an example of a manufacturing method of a solid-state imaging element according to the first embodiment.

Next, the photodiode 219 and the transistor 250 are formed on the first surface F1. Moreover, the interlayer insulation film 262 and the wiring 261 are formed on the transistor 250. Accordingly, the structure illustrated in FIG. 8 is obtained. When the transistor 250 is formed, the source and drain diffusion layers 252 are also formed. The depth of the diffusion layer 252 is formed to be shallower than the depth of the element isolation film 234.

(Rear End Step)

Next, a processing step from the second surface F2 of the semiconductor substrate 218 is performed.

Figure 9:
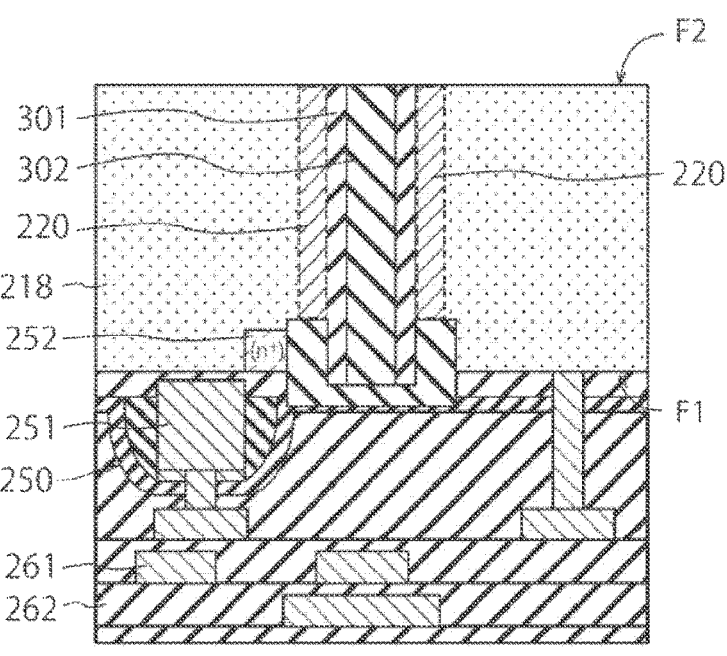
FIG. 9 is a cross-sectional view illustrating an example of a manufacturing method of a solid-state imaging element according to the first embodiment.

The semiconductor substrate 218 is polished from the second surface F2 side by using a chemical mechanical polishing (CMP) method or the like to thin the semiconductor substrate 218 to a desired thickness. Accordingly, the structure illustrated in FIG. 9 is obtained.

Figure 10:
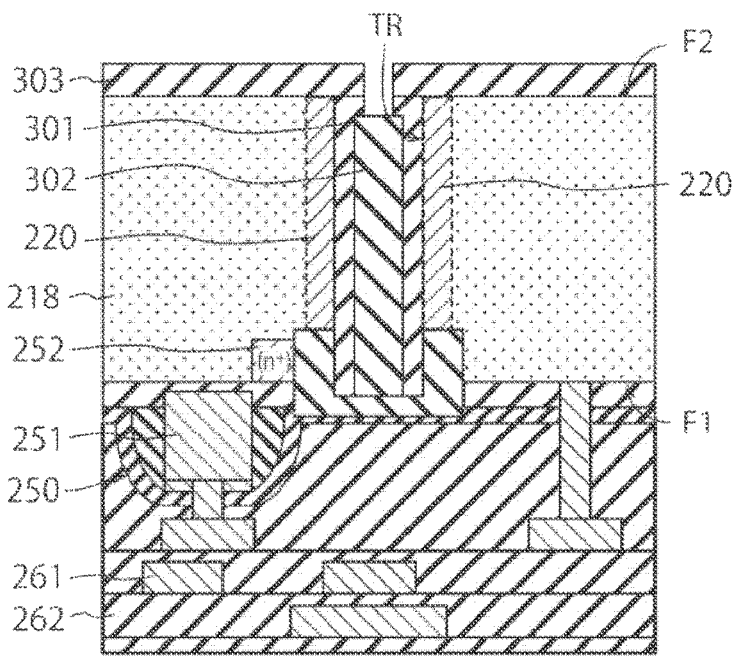
FIG. 10 is a cross-sectional view illustrating an example of a manufacturing method of a solid-state imaging element according to the first embodiment.

Next, as illustrated in FIG. 10, a material (for example, a silicon oxide film) of a hard mask 303 is deposited on the second surface F2. Next, the material of the hard mask 303 is processed so as to open the region of the trench TR by using the lithography technology and the etching technology.

Figure 11:
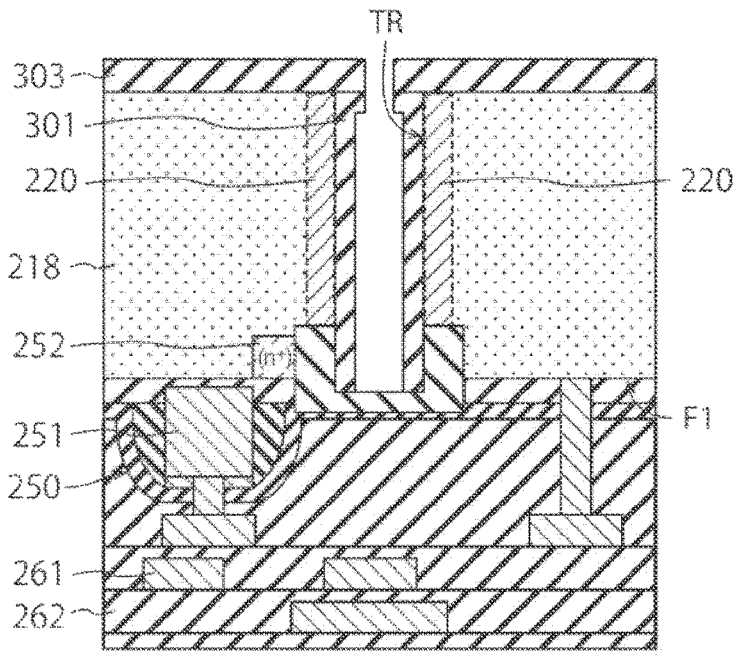
FIG. 11 is a cross-sectional view illustrating an example of a manufacturing method of a solid-state imaging element according to the first embodiment.

Next, as illustrated in FIG. 11, by using the hard mask 303 as a mask, the sacrificial film 302 is isotropically etched and removed by using a chemical dry etching (CDE) method or the like. At this time, since the sidewall of the trench TR is covered by the insulation film 301, etching is not performed.

Figure 12:
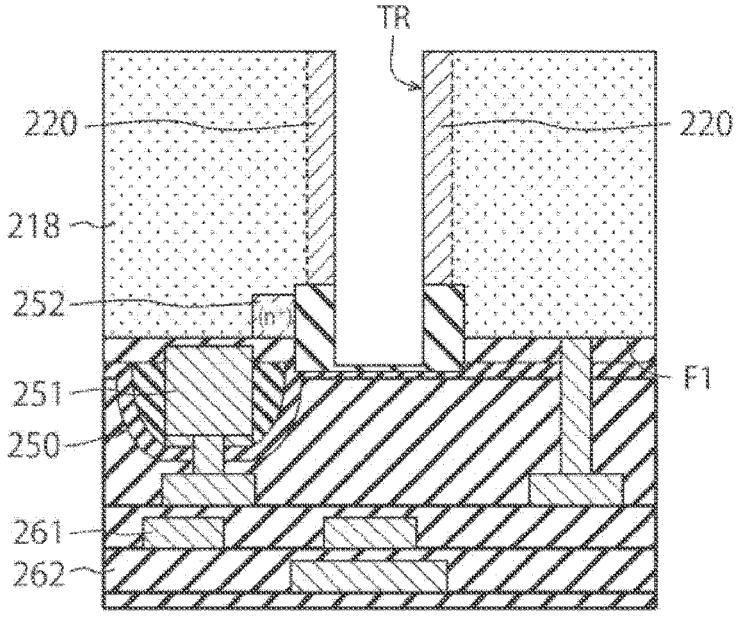
FIG. 12 is a cross-sectional view illustrating an example of a manufacturing method of a solid-state imaging element according to the first embodiment.

Next, as illustrated in FIG. 12, the insulation film 301 is removed by using the CDE method or the like, and the hard mask 303 on the second surface F2 is also removed.

Figure 13:
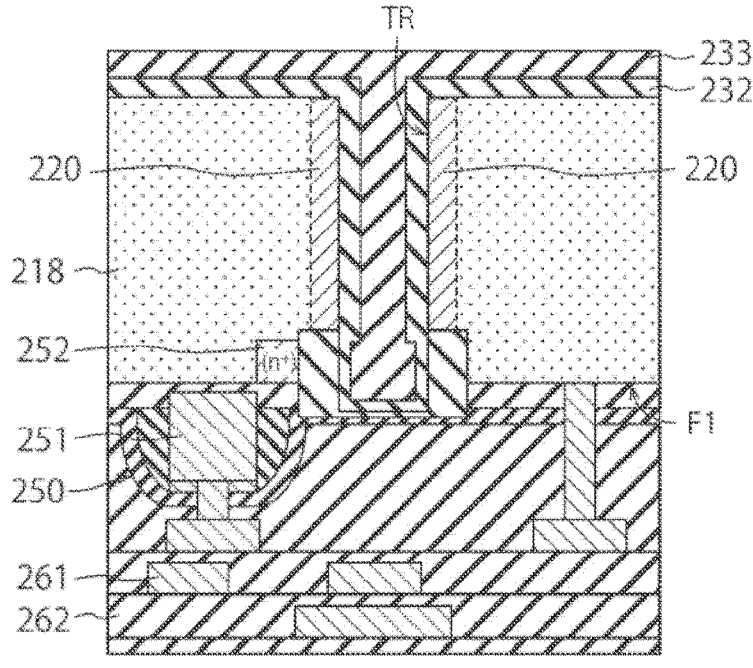
FIG. 13 is a cross-sectional view illustrating an example of a manufacturing method of a solid-state imaging element according to the first embodiment.

Next, as illustrated in FIG. 13, the fixed charge film 232 is deposited on the inner wall of the trench TR. At this time, the fixed charge film 232 is thinly deposited on the inner wall of the trench TR so as not to fill the trench TR. By forming the fixed charge film 232 on the inner wall of the trench TR, the charge (positive charge) is induced in the semiconductor substrate 218 in the vicinity of the inner wall of the trench TR.

Next, the trench TR is filled with the pixel isolation film 233. Accordingly, the structure illustrated in FIG. 13 is obtained.

Thereafter, the light shielding film 214, the planarization film 213, and the color filter 212 are formed, and the on-chip lens 211 is further formed on the color filter 212. As a result, the solid-state imaging element according to the first embodiment is made.

According to the present embodiment, the element isolation film 234 covers the end of the fixed charge film 232 and the end of the pixel isolation film 233 along the through trench TR. Therefore, the charge induction layer 220 and the diffusion layer 252 can be insulated and isolated, and a dark current of the pixel 100 can be suppressed.

Furthermore, according to the present embodiment, in the front end step, the trench TR is filled with the insulation film 301 and the sacrificial film 302. The insulation film 301 and the sacrificial film 302 include, for example, a material having high heat resistance, such as a silicon oxide film or polysilicon. Therefore, a high-temperature process can be used in the front end step of forming the transistor 250, the wiring 261, and the like on the first surface F1.

When the trench TR is filled with a material having low heat resistance, such as a metal material in the front end step, a high temperature process required in the front end step cannot be used.

On the other hand, according to the present embodiment, in the front end step, the trench TR is filled with the insulation film 301 and the sacrificial film 302, which have a heat resistance higher than that of the metal material. Therefore, the high temperature process can be used in the front end step.

On the other hand, in the rear end step, the fixed charge film 232 can be formed on the inner wall of the trench TR. The fixed charge film 232 induces a charge in the charge induction layer 220 in the vicinity of the inner wall of the trench TR. Therefore, the dark current is suppressed, and the random noise in the pixel 100 can be reduced.

Second Embodiment

Figure 14:
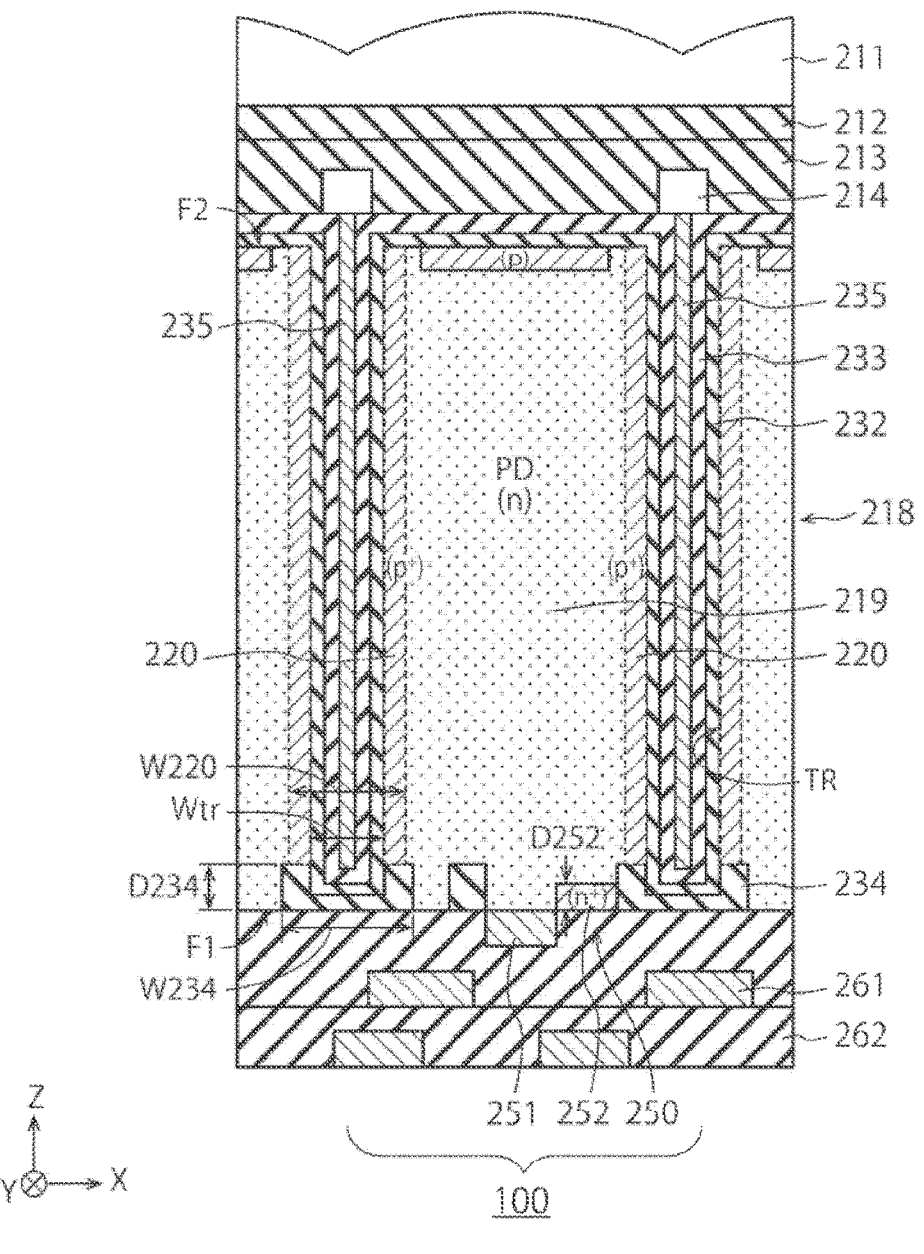
FIG. 14 is a cross-sectional view illustrating a configuration example of a pixel according to a second embodiment.

FIG. 14 is a cross-sectional view illustrating a configuration example of a pixel 100 according to the second embodiment. The plan view of the pixel 100 according to the second embodiment may be basically the same as that in FIG. 6.

In the second embodiment, a light shielding film 235 is provided on an inner side of the pixel isolation film 233 in the trench TR. The light shielding film 235 is provided along the trench TR when viewed from above the first surface F1, and extends in a Z direction between the first surface F1 and the second surface F2. Accordingly, the light shielding film 235 is provided between a plurality of adjacent pixels 100, and optically isolates the pixels 100 from each other. Therefore, crosstalk between a plurality of the pixels 100 can be further suppressed.

The light shielding film 235 includes a metal material having high light shielding properties. For example, a single metal material such as tungsten or aluminum, a stacked film of aluminum and a barrier metal (for example, titanium, cobalt, and the like), a stacked film of tungsten and a barrier metal (for example, titanium, cobalt, and the like), a stacked film of aluminum and cobalt, or the like can be used for the light shielding film 235. Other configurations of the second embodiment may be similar to those of the first embodiment.

In the manufacturing method of the pixel 100 according to the second embodiment, after the fixed charge film 232 is formed in the trench TR, the pixel isolation film 233 is formed on the fixed charge film 232 in the trench TR. At this time, the material of the pixel isolation film 233 is thinly formed on the fixed charge film 232 without completely filling the inside of the trench TR.

Next, the material of the light shielding film 235 fills the inside of the trench TR. Accordingly, the light shielding film 235 covered with the pixel isolation film 233 is formed at the center portion of the trench TR.

Other manufacturing methods of the second embodiment may be the same as the corresponding manufacturing method of the first embodiment. As a result, the solid-state imaging element according to the second embodiment is made.

According to the second embodiment, the light shielding film 235 is formed in the trench TR in the rear end step. Thus, even when a metal material having low heat resistance is used for the light shielding film 235, a high-temperature process can be executed in the front end step. Furthermore, the second embodiment can obtain the effects similar to those of the first embodiment.

Third Embodiment

Figure 15:
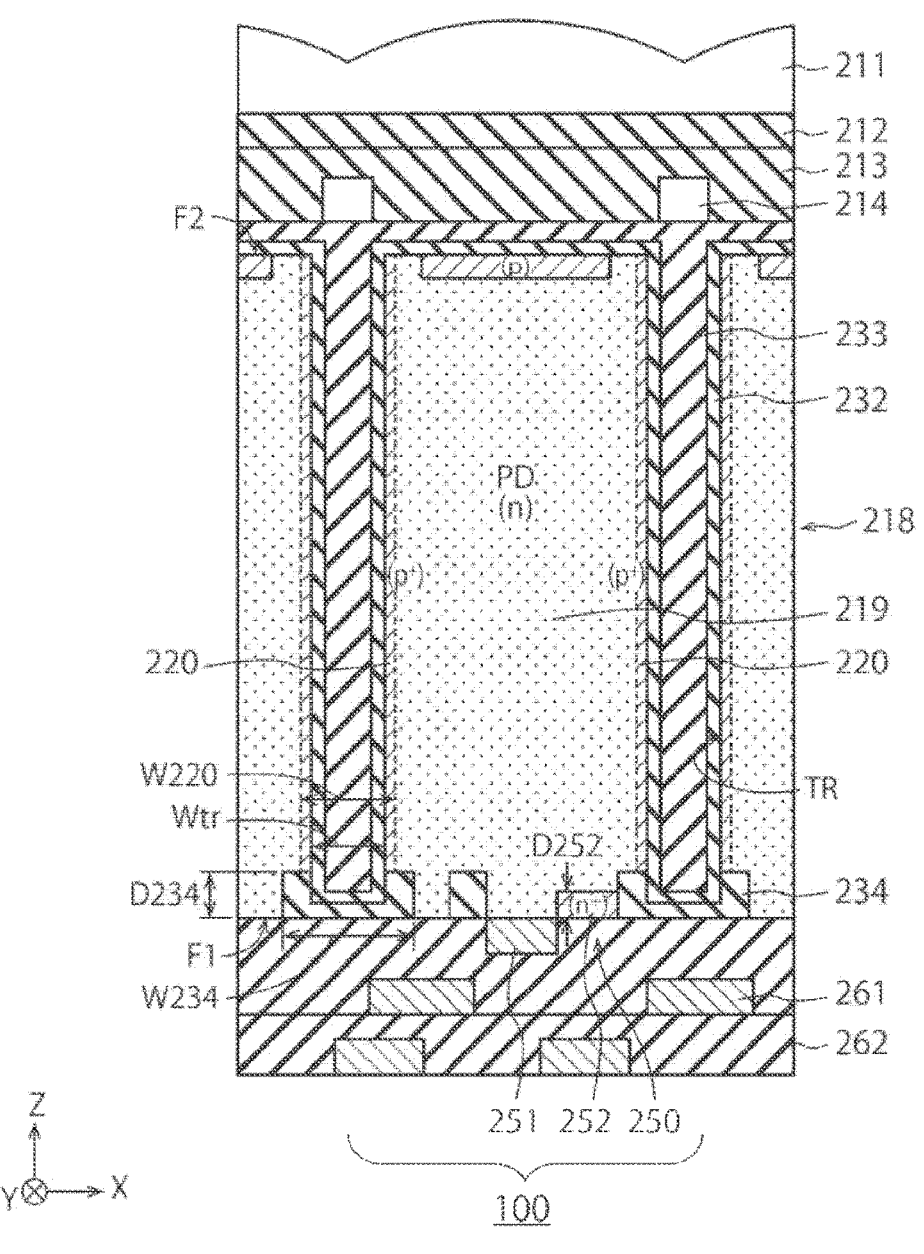
FIG. 15 is a cross-sectional view illustrating a configuration example of a pixel according to a third embodiment.

FIG. 15 is a cross-sectional view illustrating a configuration example of a pixel 100 according to the third embodiment. The plan view of the pixel 100 according to the third embodiment may be basically the same as that in FIG. 6.

In the third embodiment, the charge induction layer 220 is a p-type charge layer induced by the fixed charge film 232, and no impurity is introduced into the inner wall of the trench TR. When the p-type charge layer is sufficiently induced on the inner wall of the trench TR by the fixed charge film 232, the charge induction layer 220 is formed without introducing the impurity into the region of the charge induction layer 220. Therefore, the dark current can be suppressed. In this case, a step of introducing an impurity into the inner wall of the trench TR can be omitted. Other configurations and the manufacturing method of the third embodiment may be similar to those of the first embodiment.

Thus, the third embodiment can obtain the same effects as those of the first embodiment. Furthermore, according to the third embodiment, the manufacturing process can be shortened as compared with the first embodiment.

Fourth Embodiment

Figure 16:
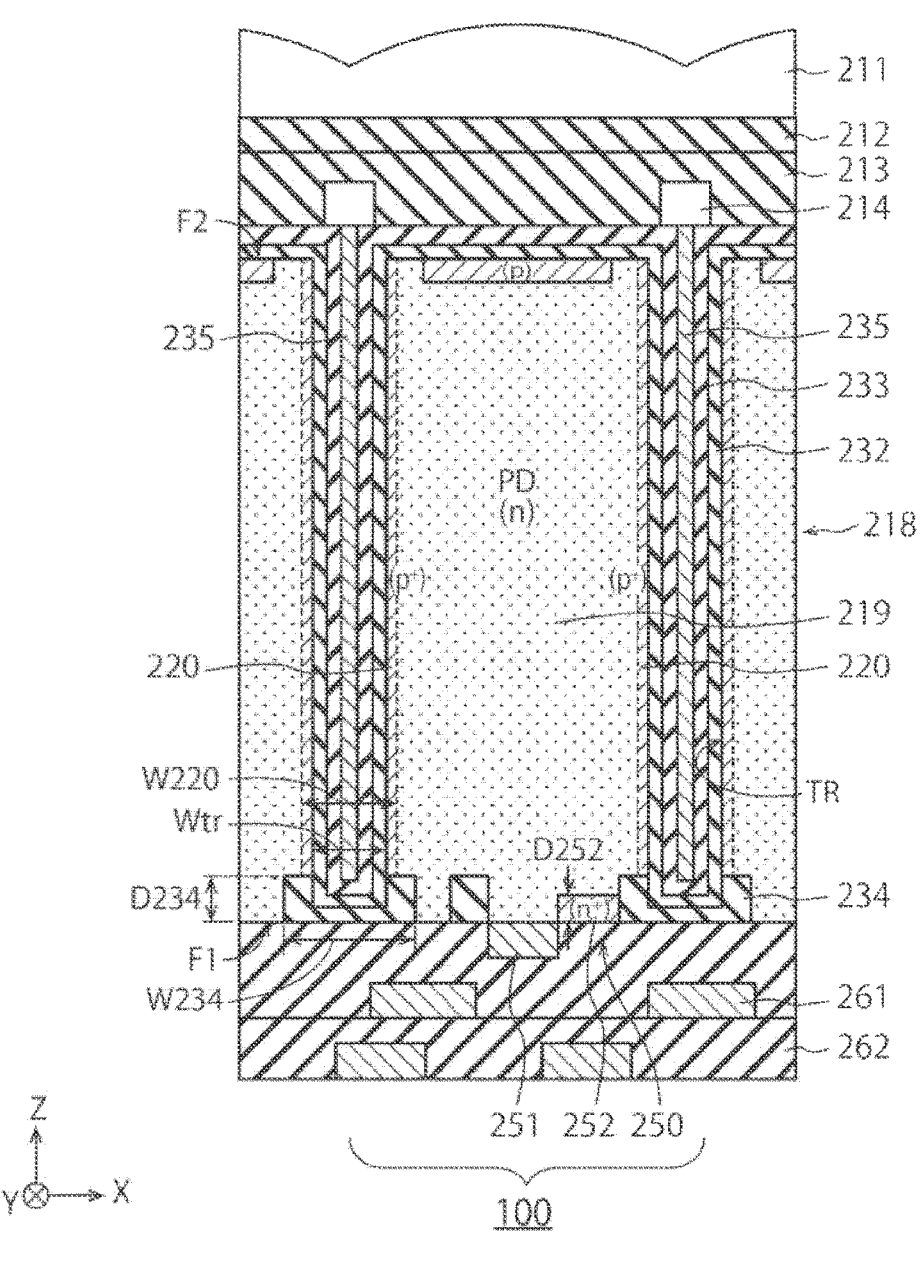
FIG. 16 is a cross-sectional view illustrating a configuration example of a pixel according to a fourth embodiment.

FIG. 16 is a cross-sectional view illustrating a configuration example of a pixel 100 according to the fourth embodiment. The fourth embodiment is a combination of the second and third embodiments. Accordingly, the pixel 100 according to the fourth embodiment further includes a light shielding film 235 in the trench TR, and the p-type impurity is not introduced into the charge induction layer 220. Other configurations and the manufacturing method of the fourth embodiment may be similar to those of the second embodiment or third embodiment. Therefore, the fourth embodiment can obtain the same effects as those of the second and third embodiments.

Fifth Embodiment

Figure 17:
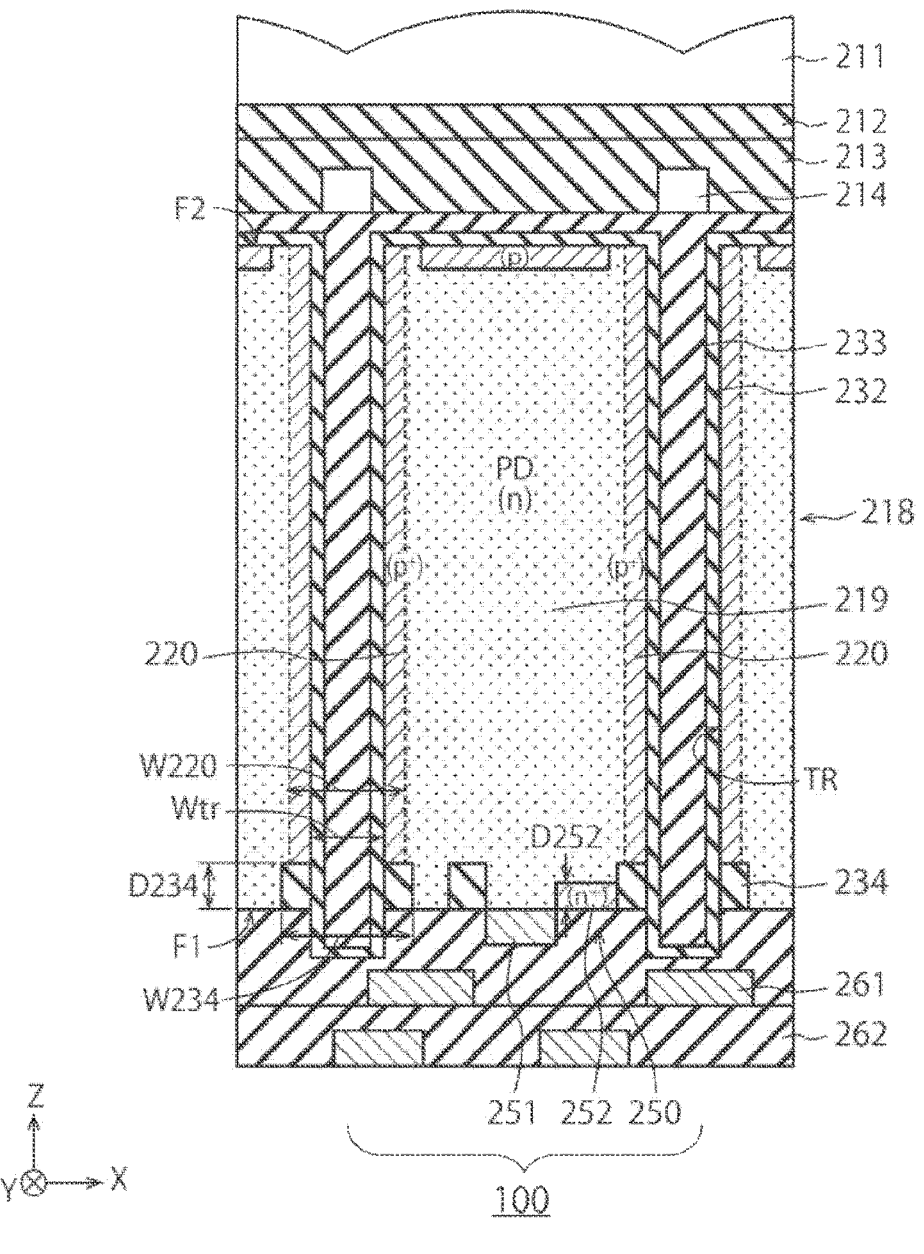
FIG. 17 is a cross-sectional view illustrating a configuration example of a pixel according to a fifth embodiment.

FIG. 17 is a cross-sectional view illustrating a configuration example of a pixel 100 according to the fifth embodiment. In the pixel 100 according to the fifth embodiment, the trench TR penetrates the element isolation film 234 from the first surface F1 and protrudes toward the interlayer insulation film 262. Accordingly, the end of the fixed charge film 232 and the end of the pixel isolation film 233 on the first surface F1 side penetrate the element isolation film 234 from the first surface F1 and protrude toward the interlayer insulation film 262.

As described above, even when the fixed charge film 232 and the pixel isolation film 233 penetrate the element isolation film 234, the element isolation film 234 is still provided on both sides of the fixed charge film 232 and pixel isolation film 233, and is provided along the trench TR on the first surface F1. Other configurations of the fifth embodiment may be similar to those of the first embodiment. Therefore, in the solid-state imaging element according to the fifth embodiment, the effects similar to those of the first embodiment can be obtained.

In the manufacturing method of the solid-state imaging element according to the fifth embodiment, after the steps illustrated in FIGS. 7 to 11, in the step illustrated in FIG. 12, the insulation film 301 is removed, and a part of the element isolation film 234 and a part of the interlayer insulation film 262 are etched at the bottom of the trench TR. Accordingly, the trench TR is formed so as to penetrate the element isolation film 234 and reach the interlayer insulation film 262. Thereafter, the solid-state imaging element according to the fifth embodiment is made through the step described with reference to FIG. 13.

Sixth Embodiment

Figure 18:
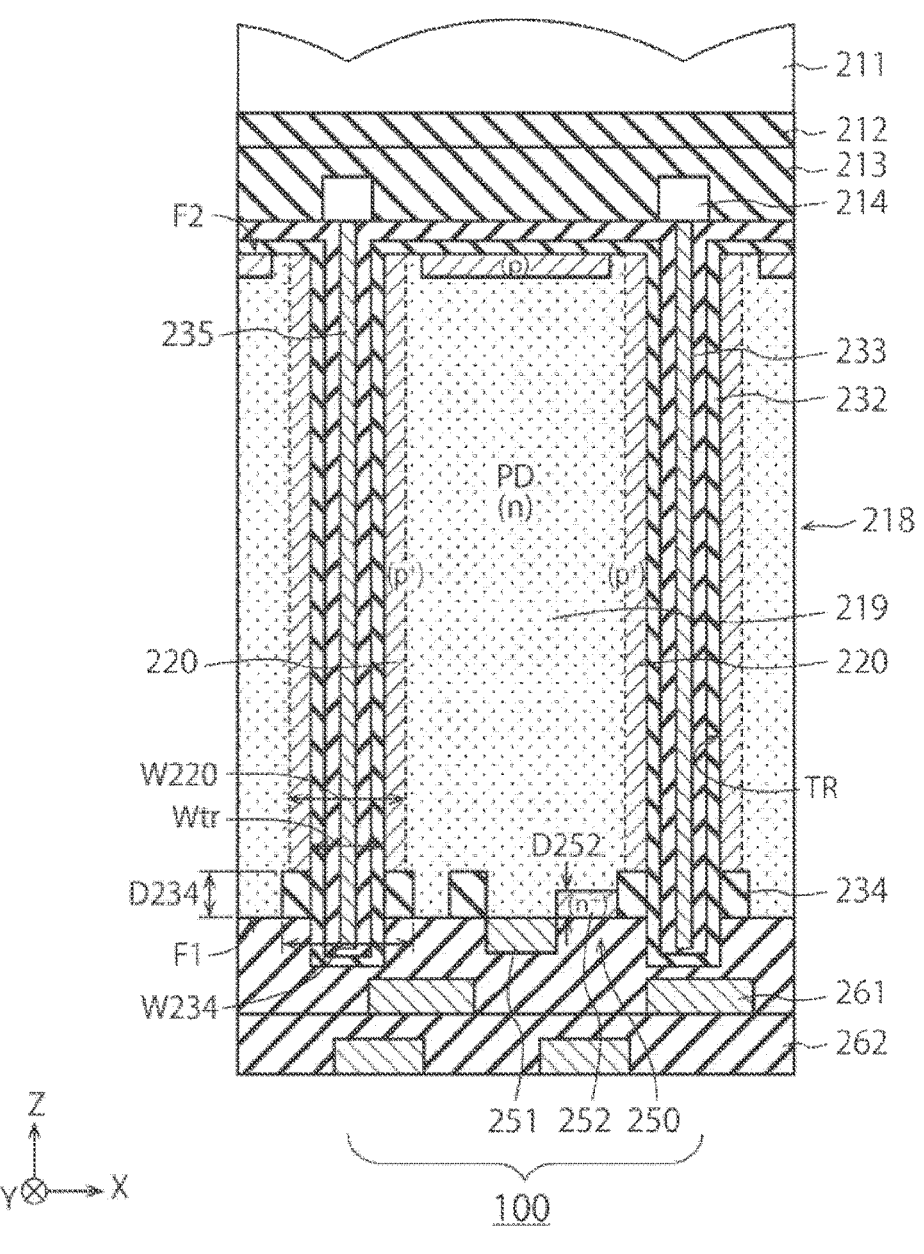
FIG. 18 is a cross-sectional view illustrating a configuration example of a pixel according to a sixth embodiment.

FIG. 18 is a cross-sectional view illustrating a configuration example of a pixel 100 according to the sixth embodiment. In the pixel 100 according to the sixth embodiment, the trench TR penetrates the element isolation film 234 from the first surface F1 and protrudes toward the interlayer insulation film 262. Accordingly, the fixed charge film 232, the pixel isolation film 233, and the light shielding film 235 penetrate the element isolation film 234 from the first surface F1 and protrude toward the interlayer insulation film 262.

As described above, even when the fixed charge film 232, the pixel isolation film 233, the light shielding film 235 penetrate the element isolation film 234, the element isolation film 234 is provided on both sides of the fixed charge film 232 and pixel isolation film 233, and is provided along the trench TR on the first surface F1. Other configurations of the sixth embodiment may be similar to those of the second embodiment. Therefore, in the solid-state imaging element according to the sixth embodiment, the effects similar to those of the second embodiment can be obtained.

Since the manufacturing method of the solid-state imaging element according to the sixth embodiment can be easily analogized from the manufacturing methods of the second and fifth embodiments, the description thereof will be omitted.

According to the sixth embodiment, since the light shielding film 235 also penetrates the element isolation film 234 and protrudes toward the interlayer insulation film 262, light shielding properties between adjacent pixels 100 can be improved, and crosstalk can be further suppressed.

(In-Vehicle Fixed Phrase)

The technology (present technology) according to the present disclosure can be applied to various products. For example, the technology according to the present disclosure may be realized as a device mounted on any type of mobile body such as an automobile, an electric vehicle, a hybrid electric vehicle, a motorcycle, a bicycle, a personal mobility, an airplane, a drone, a ship, or a robot.

Figure 19:
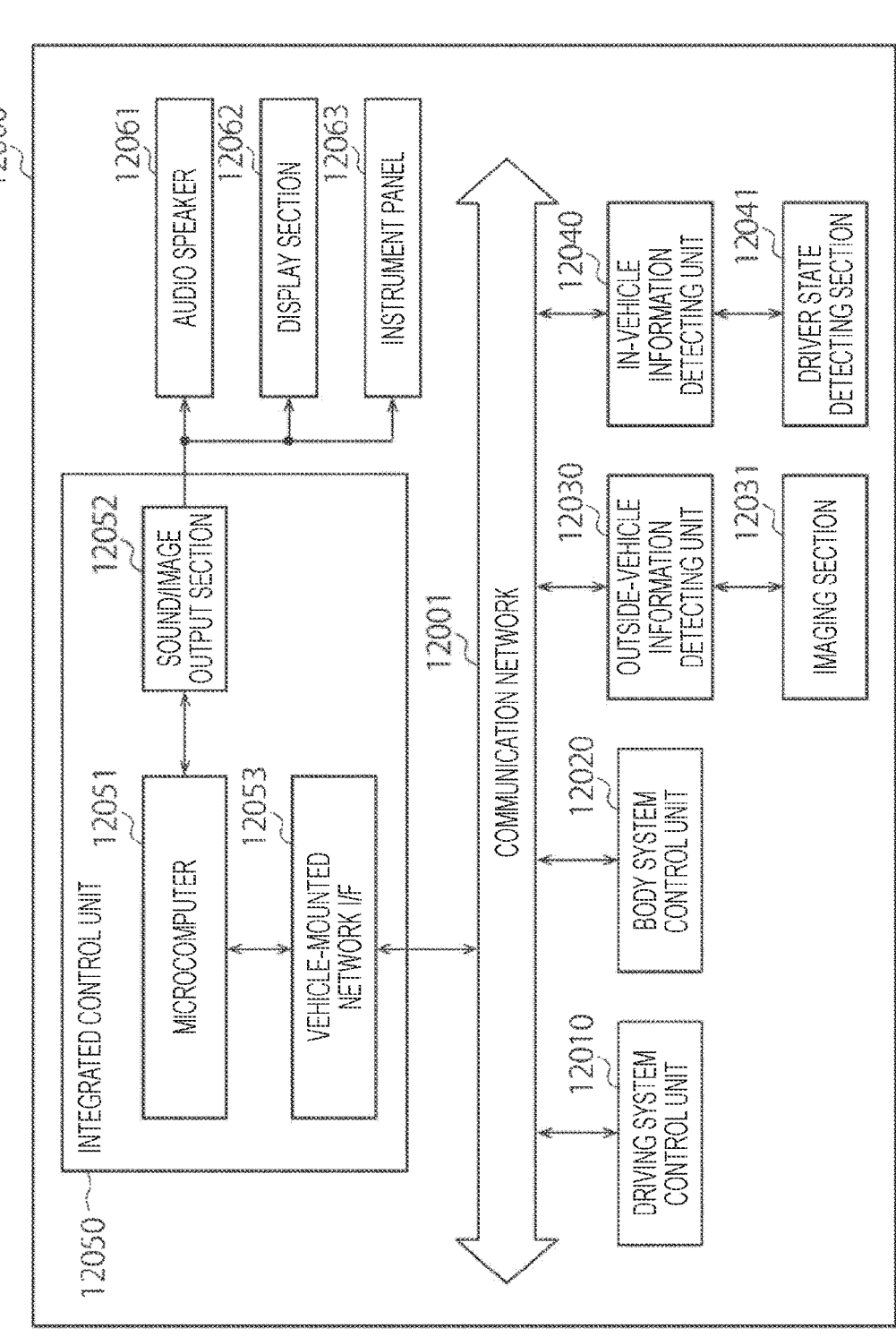
FIG. 19 is a block diagram illustrating a schematic configuration example of a vehicle control system as an example of a mobile body control system to which the technology according to the present disclosure can be applied.

FIG. 19 is a block diagram illustrating a schematic configuration example of a vehicle control system as an example of a mobile body control system to which the technology according to the present disclosure can be applied.

The vehicle control system 12000 includes a plurality of electronic control units connected to each other via a communication network 12001. In the example illustrated in FIG. 19, the vehicle control system 12000 includes a driving system control unit 12010, a body system control unit 12020, an outside-vehicle information detecting unit 12030, an in-vehicle information detecting unit 12040, and an integrated control unit 12050. Furthermore, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto. The solid-state imaging element 1 according to the present disclosure may be provided in the imaging section 12031.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like. The solid-state imaging element 1 according to the present disclosure may be the imaging section 12031, or may be provided separately from the imaging section 12031.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

Furthermore, the microcomputer 12051 can output a control command to the body system control unit 12020 on the basis of information regarding the outside of the vehicle, the information being acquired by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. An audio speaker 12061, a display section 12062, and an instrument panel 12063 are illustrated as the output device. The display section 12062 may, for example, include at least one of an on-board display and a head-up display.

Figure 20:
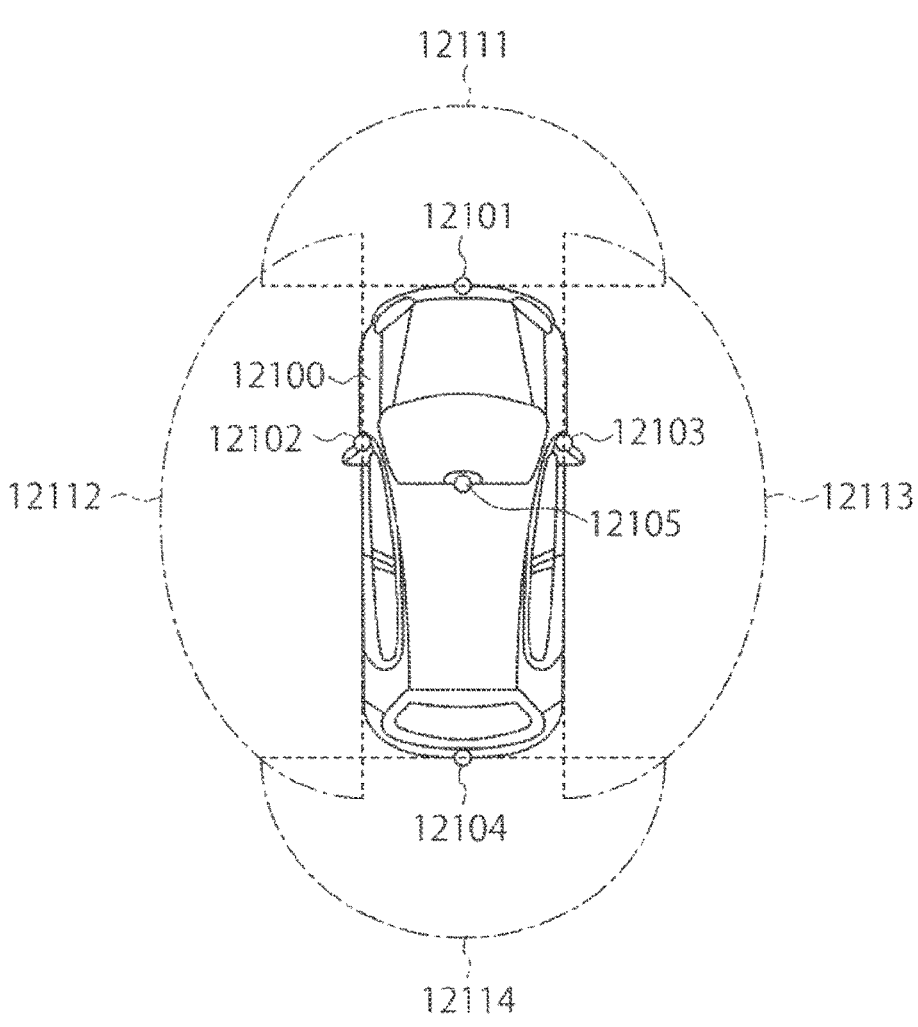
FIG. 20 is a diagram illustrating an example of an installation position of an imaging section.

FIG. 20 is a diagram illustrating an example of an installation position of the imaging section 12031.

In FIG. 20, a vehicle 12100 includes, as the imaging section 12031, imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors mainly obtain images of the sideward sides of the vehicle 12100. The imaging section 12104 provided to the rear bumper or the back door obtains mainly an image of the rear of the vehicle 12100. The forward side images obtained by the imaging sections 12101 and 12105 are mainly used to detect a preceding vehicle, a pedestrian, an obstacle, a traffic light, a traffic sign, a lane, or the like.

Note that FIG. 20 illustrates an example of imaging ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure can be applied has been described above. The solid-state imaging element according to the present disclosure can be applied to, for example, the imaging section 12031 among the above-described configurations. Therefore, the imaging section 12031 can obtain the effects of the above-described embodiment.

Seventh Embodiment

Figure 21:
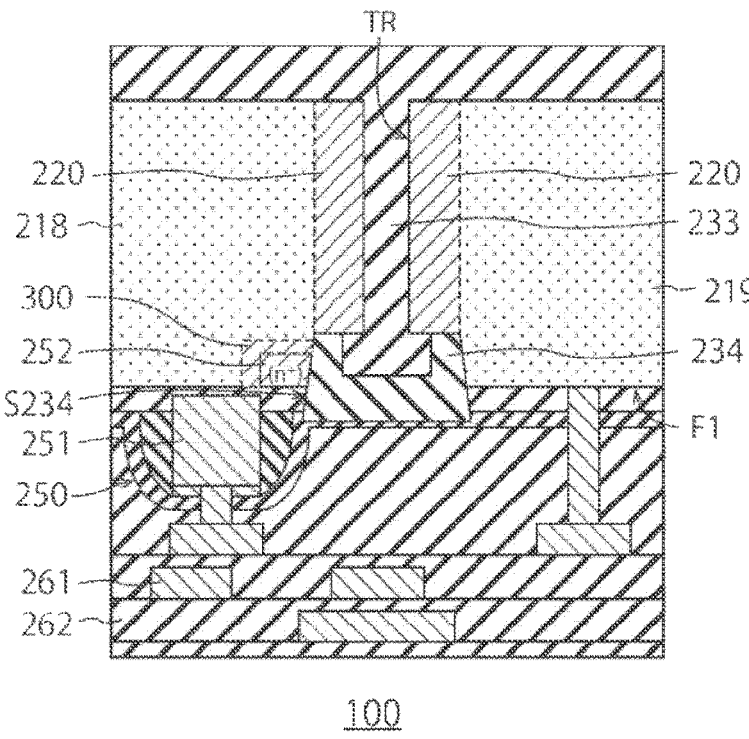
FIG. 21 is a cross-sectional view illustrating a partial configuration example of a pixel according to a seventh embodiment.

FIG. 21 is a cross-sectional view illustrating a partial configuration example of a pixel 100 according to the seventh embodiment. FIG. 21 illustrates a cross section of the end portion of the trench TR on the first surface F1 side. The seventh embodiment may also be applied to a back-side illumination CIS or a front-side illumination CIS. The plan view of the seventh embodiment may be basically similar to the plan view of FIG. 6. Therefore, the element isolation film 234 is provided on the first surface F1 of the substrate 218, and is provided on both sides of the trench TR or along the trench TR when viewed from the first surface F1. Furthermore, when viewed from the first surface F1, the element isolation film 234 is formed to be wider than the pixel isolation film 233. Note that the pixel isolation film 233 is a so-called full trench isolation (FTI) penetrating the substrate 218 between the first surface F1 and the second surface F2, and the element isolation film 234 is a so-called shallow trench isolation (STI) formed in a surface region of the first surface F1 shallower than the pixel isolation film 233.

Moreover, in the seventh embodiment, the diffusion layer 252 is in contact with the side surface S234 of the element isolation film 234. The diffusion layer 252 is a high-concentration impurity diffusion layer having an $n^+$-type impurity of a conductivity type opposite to that of the charge induction layer 220. Therefore, a depletion layer 300 spreads in the substrate 218 around the diffusion layer 252. The diffusion layer 252 may be a diffusion layer of a source and drain of the transistor 250, or may be another diffusion layer such as a floating diffusion region. On the other hand, the end of the pixel isolation film 233 on the first surface F1 side is not exposed from the side surface S234 of the element isolation film 234. Therefore, the pixel isolation film 233 is separated from the depletion layer 300 and is configured not to be in contact with the depletion layer 300. That is, the interface between the pixel isolation film 233 and the element isolation film 234 is inside the element isolation film 234, and is not exposed to (does not face) the side surface S234 of the element isolation film 234. Accordingly, the pixel isolation film 233 is configured not to be in contact with the depletion layer 300.

The pixel isolation film 233 may be formed by forming the element isolation film 234 and the trench TR and then embedding a filling material from the second surface F2 side. In this case, the sacrificial film previously embedded in the trench TR is removed from the second surface F2 side of the substrate 218, and then the filling material (for example, a silicon oxide film) of the pixel isolation film 233 fills the trench TR. Here, in a series of steps of removing the sacrificial film, a part of the filling material (for example, a silicon oxide film) of the element isolation film 234 may be simultaneously removed, and a cavity may be formed in the element isolation film 234 via the trench TR. When this cavity reaches the side surface S234 of the element isolation film 234, the substrate 218 (for example, a silicon substrate) having relatively high interface state density is exposed in the cavity on the side surface S234 of the element isolation film 234. In this case, when the filling material of the pixel isolation film 233 is embedded in the trench TR and the cavity, the pixel isolation film 233 is also formed on the side surface S234 of the element isolation film 234, and the interface state density between the pixel isolation film 233 and the substrate 218 exposed on the side surface S234 of the element isolation film 234 increases. When the pixel isolation film 233 reaching the side surface S234 of the element isolation film 234 is in contact with the depletion layer 300 extending from the diffusion layer 252, junction leakage occurs due to a noise charge generated at the interface between the pixel isolation film 233 and the depletion layer 300, and image quality deterioration, for example, a dark current is generated. Furthermore, in a case where the pixel isolation film 233 includes a negative fixed charge, the positive charge induction layer 220 is generated at the interface between the pixel isolation film 233 and the depletion layer 300, and the electric field of the portion thereof is increased. Therefore, the junction leakage further occurs, and deterioration of the image quality is caused.

On the other hand, in the seventh embodiment, the end of the pixel isolation film 233 on the first surface F1 side is not exposed from the side surface S234 of the element isolation film 234, and the pixel isolation film 233 is separated from the depletion layer 300. Thus, the surface of the substrate 218 having the high interface state density is not exposed on the side surface S234 of the element isolation film 234, and the pixel isolation film 233 is not in contact with the depletion layer 300. Therefore, the junction leakage can be suppressed, and deterioration of the image quality due to the dark current or the like can be suppressed.

Other configurations of the seventh embodiment may be the same as any of the first to sixth embodiments. Therefore, the seventh embodiment can obtain the effects similar to those of the first to sixth embodiments.

FIGS. 22 to 26 are cross-sectional views illustrating an example of the manufacturing method of the solid-state imaging element according to the seventh embodiment.
(Front End Step)

A processing step from the first surface F1 of the semiconductor substrate 218 is performed.

First, a hard mask HM is formed on the first surface F1, and the hard mask HM is processed using a lithography technology and an etching technology. The hard mask HM is, for example, an insulation film such as a silicon oxide film or a silicon nitride film. Next, the hard mask HM is used as a mask, and the trench TR is formed between adjacent pixels 100 by using the etching technology. The trench TR is formed in the substrate 218 from the first surface F1 toward the second surface F2 of the semiconductor substrate 218. At this time, the trench TR may penetrate the semiconductor substrate 218, but may not penetrate the semiconductor substrate 218 at this stage. In this case, the second surface F2 of the semiconductor substrate 218 may be polished in a rear end step, and the trench TR may penetrate the semiconductor substrate 218. Note that, in the seventh embodiment, the trench TR is formed before the formation of the element isolation film 234, but the element isolation film 234 may be formed before the formation of the trench TR as in the first embodiment.

Next, as necessary, a p-type diffusion layer is formed as the charge induction layer (not illustrated in FIG. 22) on the sidewall of the trench TR.

Figure 22:
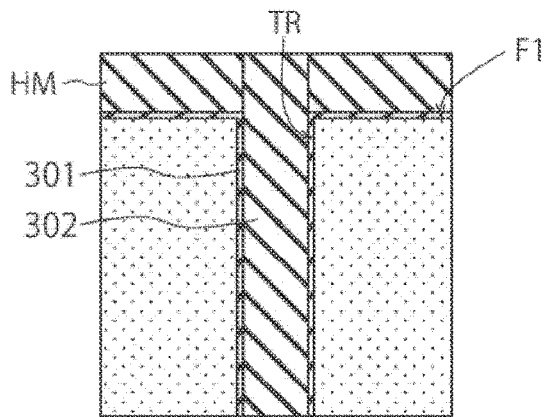
FIG. 22 is a cross-sectional view illustrating an example of a manufacturing method of a solid-state imaging element according to the seventh embodiment.
Figure 23:
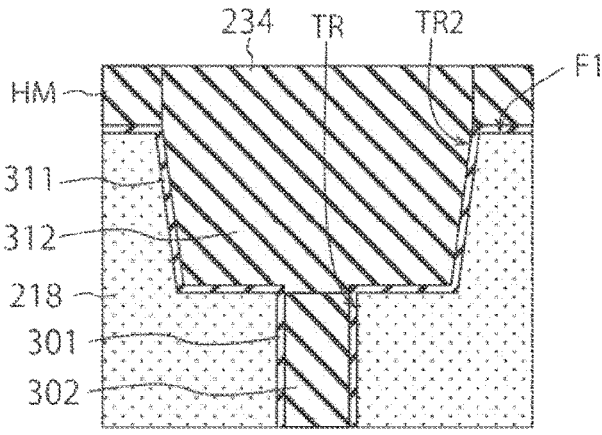
FIG. 23 is a cross-sectional view illustrating an example of a manufacturing method subsequent to FIG. 22.

Next, an insulation film (liner layer) 301 such as a silicon oxide film is formed on the inner wall of the trench TR, and then the inside of the trench TR is filled with the sacrificial film 302 such as polysilicon. The sacrificial film 302 is a material that can be selectively etched with respect to the insulation film 301. The sacrificial film 302 includes, for example, a material that can be selectively etched with respect to the insulation film 301 including polysilicon or amorphous silicon. Next, the material of the sacrificial film 302 on the hard mask HM is removed by using CMP or wet etching, and the height of the sacrificial film 302 in the trench TR is adjusted. Accordingly, the structure illustrated in FIG. 22 is obtained.

Next, a trench TR2 is formed on the first surface F1 side of the semiconductor substrate 218. The trench TR2 is formed in a formation region of the element isolation film 234 between the adjacent pixels 100. The trench TR2 removes the upper portion of the semiconductor substrate 218 in the element isolation region by using a lithography technology and an etching technology. Accordingly, the trench TR2 shallower than the trench TR is formed in the element isolation region. Thereafter, a thermal oxide film 311 of the substrate 218 is formed on the inner wall of the trench TR2, and an insulation film 312 such as a silicon oxide film the inside of the thermal oxide film 311. Accordingly, the element isolation film 234 is formed. Here, the element isolation film 234 (that is, the trench TR2) is formed to be wider than the trench TR and the charge induction layer 220. Moreover, in a plan view seen from above the first surface F1 (Z direction), the element isolation film 234 is formed to be wider than the pixel isolation film 233 to be formed later in the element isolation film 234. Accordingly, the pixel isolation film 233 is prevented from being exposed from the side surface S234 of the element isolation film 234.

Other steps in the front end step of the seventh embodiment may be similar to the corresponding steps in the front end step of the first embodiment. For example, various ion implantation, formation of a gate electrode, activation annealing, formation of a wiring layer, and the like are performed. Moreover, another semiconductor chip having a logic circuit is connected to the first surface F1. Note that, in FIG. 22 and subsequent drawings, the photodiode 219, the transistor 250, the wiring 261, other joined semiconductor chips, and the like are omitted.
(Rear End Step)

Next, a processing step from the second surface F2 of the semiconductor substrate 218 is performed.

The semiconductor substrate 218 is polished from the second surface F2 side by using a CMP method or the like to thin the semiconductor substrate 218 to a desired thickness. Accordingly, the trench TR penetrates the substrate 218, and one end of the sacrificial film 302 is exposed from the second surface F2.

Figure 24:
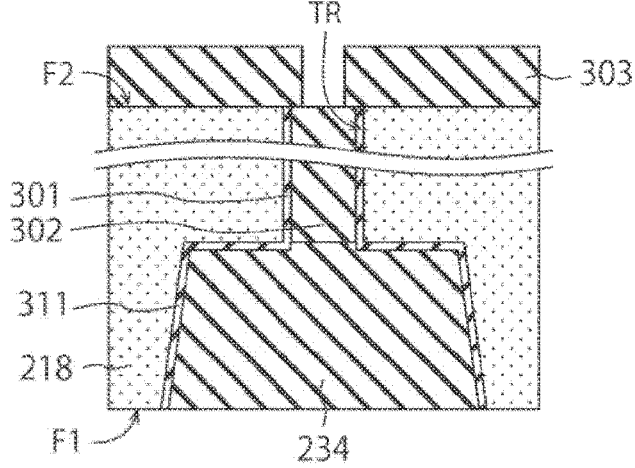
FIG. 24 is a cross-sectional view illustrating an example of a manufacturing method subsequent to FIG. 23.

Next, as illustrated in FIG. 24, a material (for example, a silicon oxide film) of the hard mask 303 is deposited on the second surface F2. Next, the material of the hard mask 303 is processed so as to open the region of the trench TR by using the lithography technology and the etching technology.

Figure 25:
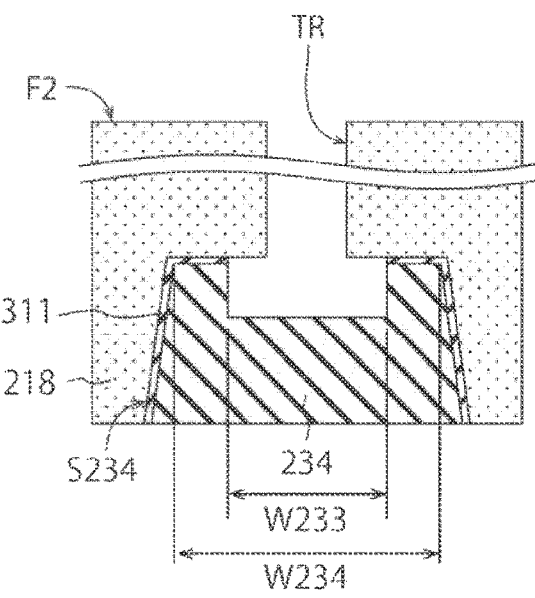
FIG. 25 is a cross-sectional view illustrating an example of a manufacturing method subsequent to FIG. 24.

Next, the hard mask 303 is used as a mask, and the sacrificial film 302 is isotropically etched and removed using the CDE or the like. Next, the hard mask 303 is removed. At this time, since the hard mask 303 includes a silicon oxide film, as illustrated in FIG. 25, the insulation film 301 on the sidewall of the trench TR, and the thermal oxide film 311 and insulation film 312 formed in the trench TR2 are also partially removed together with the hard mask 303. In this case, a cavity 320 of the trench TR extends into the element isolation film 234, and the thermal oxide film 311 is also partially removed. However, the cavity 320 is formed so as not to reach the side surface S234 of the element isolation film 234. That is, only the upper portion of the element isolation film 234 is removed such that the trench TR does not extend to the side surface S234 of the element isolation film 234. The width W233 of the cavity 320 is smaller than the width W234 of the element isolation film 234. Accordingly, the cavity 320 of the trench TR exposes the substrate 218 on a part of the upper surface of the element isolation film 234 and is in contact with the substrate 218, but does not expose the substrate 218 and is not in contact with the substrate 218 on the side surface S234 of the element isolation film 234.

Next, as necessary, the fixed charge film (not illustrated) is deposited on the inner wall of the trench TR.

Figure 26:
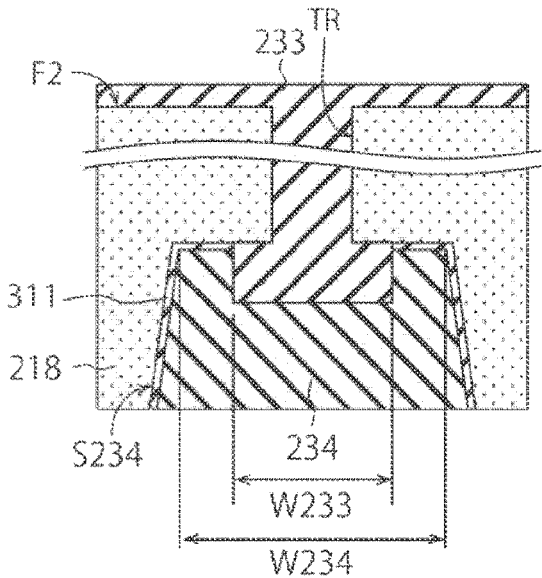
FIG. 26 is a cross-sectional view illustrating an example of a manufacturing method subsequent to FIG. 25.

Next, as illustrated in FIG. 26, the trench TR is filled with the pixel isolation film 233. At this time, the pixel isolation film 233 also fills the cavity 320. Therefore, the width W233 of the cavity 320 is the width of the pixel isolation film 233. The width W233 of the pixel isolation film 233 is smaller than the width W234 of the element isolation film 234. Accordingly, the pixel isolation film 233 in the element isolation film 234 is exposed on a part of the element isolation film 234 and is in contact with the substrate 218, but is not exposed from the side surface S234 of the element isolation film 234 and is not in contact with the substrate 218. That is, on the side surface S234 of the element isolation film 234, the pixel isolation film 233 does not have an interface with the substrate 218. The interface between the pixel isolation film 233 and the element isolation film 234 is in the element isolation film 234, but is not exposed on the side surface S234. Note that the pixel isolation film 233 may include a single insulation material. However, the pixel isolation film 233 may have a stacked structure of a plurality of kinds of material films.

Thereafter, as in the other embodiments, the light shielding film, the planarization film, and the color filter are formed, and the on-chip lens is further formed on the color filter. As a result, the solid-state imaging element according to the seventh embodiment is made.

According to the seventh embodiment, the surface of the substrate 218 having high interface state density generated by removing the thermal oxide film 311 on the inner wall of the trench TR2 is not exposed on the side surface S234 of the element isolation film, and the pixel isolation film 233 formed in a back surface step is separated from the depletion layer 300. Therefore, it is possible to suppress junction leakage caused by a noise charge generated in the depletion layer 300 in a case where the pixel isolation film 233 and the depletion layer 300 are in contact with each other. It is possible to suppress the occurrence of junction leakage due to a high electric field caused when the charge induction layer 220 is present in the depletion layer 300, which occurs in a case where the fixed charge is included in the pixel isolation film 233. Furthermore, from the viewpoint of image quality, generation of the dark current and inflow of a charge to the floating diffusion FD formed by the diffusion layer 252 can be suppressed.

Eighth Embodiment

Figure 27:
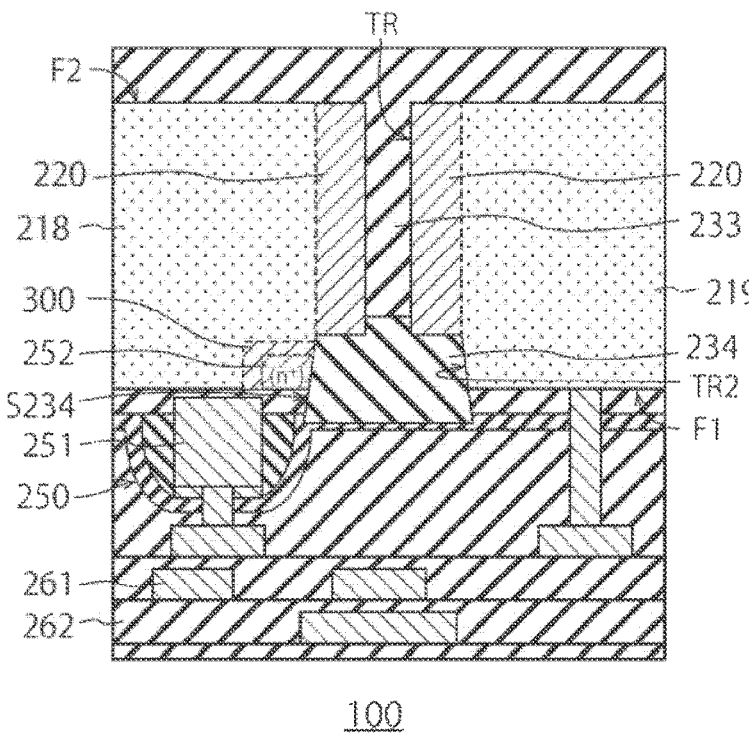
FIG. 27 is a cross-sectional view illustrating a partial configuration example of a pixel according to an eighth embodiment.

FIG. 27 is a cross-sectional view illustrating a partial configuration example of a pixel 100 according to the eighth embodiment. FIG. 27 illustrates a cross section of the end portion of the trench TR on the first surface F1 side. The eighth embodiment may also be applied to a back-side illumination CIS or a front-side illumination CIS. The plan view of the eighth embodiment may be basically similar to the plan view of FIG. 6. Therefore, the element isolation film 234 is provided on the first surface F1 of the substrate 218, and is provided on both sides of the trench TR or along the trench TR when viewed from the first surface F1. Furthermore, when viewed from the first surface F1, the element isolation film 234 is formed to be wider than the pixel isolation film 233.

In the eighth embodiment, as in the seventh embodiment, the pixel isolation film 233 is not exposed from the side surface S234 of the element isolation film 234. Moreover, in the eighth embodiment, the interface between the pixel isolation film 233 and the element isolation film 234 is in the trench TR. That is, a distance from the second surface F2 to the interface between the pixel isolation film 233 and the element isolation film 234 is shorter than the distance from the second surface F2 to the lower end of the trench TR. In the eighth embodiment, the interface between the pixel isolation film 233 and the element isolation film 234 is provided closer to the second surface F2 side as compared with the seventh embodiment. In this case, the pixel isolation film 233 does not reach the element isolation region.

In the eighth embodiment, as in the seventh embodiment, the end of the pixel isolation film 233 on the first surface F1 side is not exposed from the side surface S234 of the element isolation film 234, and the pixel isolation film 233 is separated from the depletion layer 300. Furthermore, in the eighth embodiment, the thermal oxide film 311 of the trench TR2 is not removed. Thus, the surface of the substrate 218 having high interface state density generated by removing the thermal oxide film 311 is not exposed on the side surface S234 of the element isolation film 234. Furthermore, the pixel isolation film 233 is not in contact with the depletion layer 300. Therefore, the junction leakage can be suppressed, and the dark current and the inflow of the charge to the floating diffusion FD can be suppressed.

Other configurations of the eighth embodiment may be the same as any of the first to seventh embodiments. Therefore, the eighth embodiment can obtain the effects similar to those of the first to seventh embodiments.

FIGS. 28 to 33 are cross-sectional views illustrating an example of the manufacturing method of the solid-state imaging element according to the eighth embodiment.

(Front End Step)

A processing step from the first surface F1 of the semiconductor substrate 218 is performed.

Figure 28:
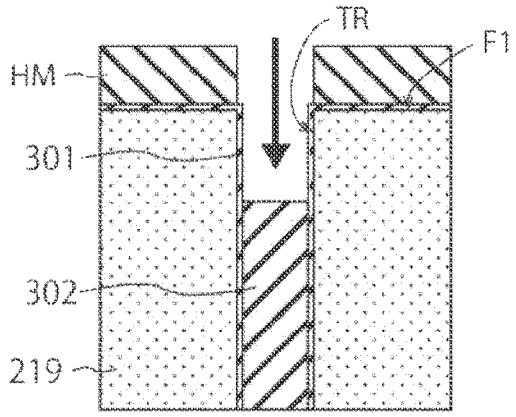
FIG. 28 is a cross-sectional view illustrating an example of a manufacturing method of a solid-state imaging element according to the eighth embodiment.

First, the structure illustrated in FIG. 22 is formed through steps similar to those in the seventh embodiment. Next, the sacrificial film 302 is partially removed from the first surface F1 side by using a wet etching method, and thus the upper surface of the sacrificial film 302 is lowered below the first surface F1. The upper surface of the sacrificial film 302 is recessed into the trench TR. The recessed amount of the upper surface of the sacrificial film 302 is adjusted such that the cavity 320 does not reach the element isolation region (trench TR2) in consideration of the amount that the material of the element isolation film 234 is etched in the rear end step to be described later. Accordingly, the structure illustrated in FIG. 28 is obtained. Note that the inner wall of the trench TR is protected by the insulation film (liner layer) 301.

Figure 29:
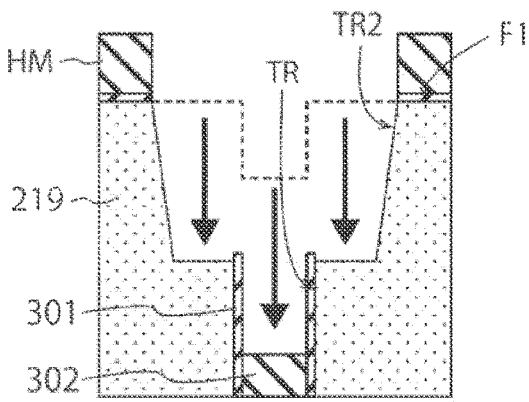
FIG. 29 is a cross-sectional view illustrating an example of a manufacturing method subsequent to FIG. 28.

Next, a trench TR2 is formed on the first surface F1 side of the semiconductor substrate 218. The trench TR2 is formed in a formation region of the element isolation film 234 between the adjacent pixels 100. The trench TR2 removes the upper portion of the semiconductor substrate 218 in the element isolation region by using a lithography technology and an etching technology. Accordingly, the trench TR2 shallower than the trench TR is formed in the element isolation region. Furthermore, when the trench TR2 is formed, the upper surface of the sacrificial film 302 is etched together with the processing for the semiconductor substrate 218. The sacrificial film 302 includes, for example, polysilicon or amorphous silicon, and thus can be etched together with the etching for the substrate 218. Therefore, the upper surface of the sacrificial film 302 can be lowered to the inside of the trench TR below the bottom surface of the trench TR2. Accordingly, the structure illustrated in FIG. 29 is obtained. Note that the inner wall of the trench TR is protected by the insulation film 301.

Figure 30:
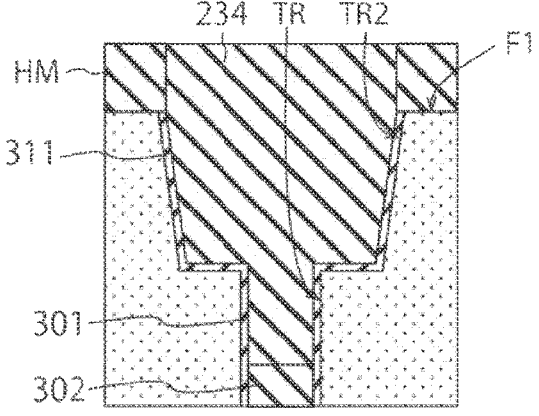
FIG. 30 is a cross-sectional view illustrating an example of a manufacturing method subsequent to FIG. 29.

Thereafter, as illustrated in FIG. 30, a thermal oxide film 311 of the substrate 218 is formed on the inner wall of the trench TR2, and an insulation film 312 such as a silicon oxide film the inside of the thermal oxide film 311. Accordingly, the element isolation film 234 is formed. Here, the material of the element isolation film 234 is embedded up to the upper surface of the sacrificial film 302 in the trench TR. Thus, the interface between the element isolation film 234 and the sacrificial film 302 is formed in the trench TR.

Other steps in the front end step of the eighth embodiment may be similar to the corresponding steps in the front end step of the first embodiment. For example, various ion implantation, formation of a gate electrode, activation annealing, formation of a wiring layer, and the like are performed. Moreover, another semiconductor chip having a logic circuit is connected to the first surface F1.

(Rear End Step)

Next, a processing step from the second surface F2 of the semiconductor substrate 218 is performed.

The semiconductor substrate 218 is polished from the second surface F2 side by using a CMP method or the like to thin the semiconductor substrate 218 to a desired thickness. Accordingly, the trench TR penetrates the substrate 218, and one end of the sacrificial film 302 is exposed from the second surface F2.

Figure 31:
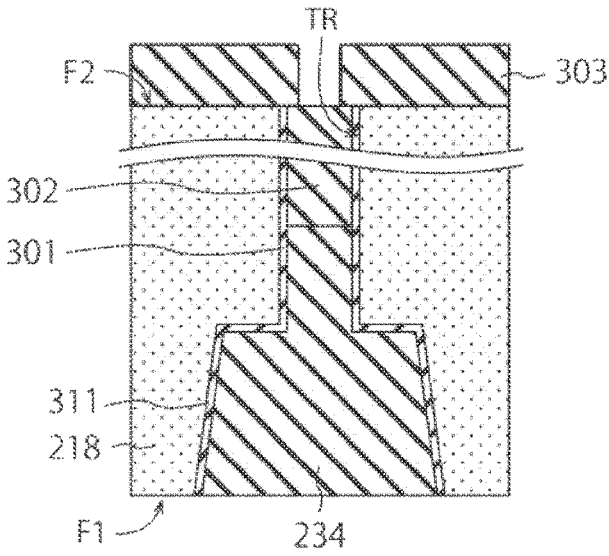
FIG. 31 is a cross-sectional view illustrating an example of a manufacturing method subsequent to FIG. 30.

Next, as illustrated in FIG. 31, a material (for example, a silicon oxide film) of the hard mask 303 is deposited on the second surface F2. Next, the material of the hard mask 303 is processed so as to open the region of the trench TR by using the lithography technology and the etching technology.

Figure 32:
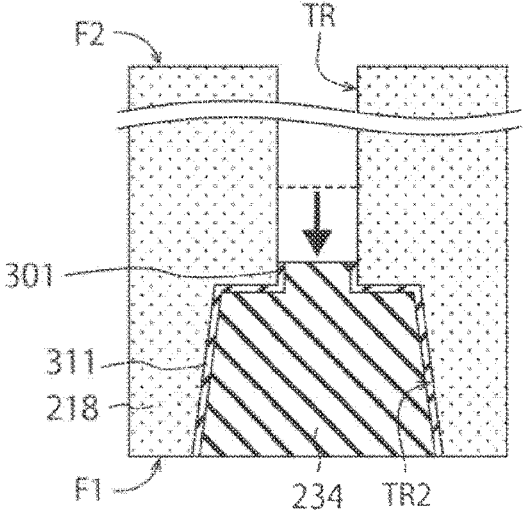
FIG. 32 is a cross-sectional view illustrating an example of a manufacturing method subsequent to FIG. 31.

Next, the hard mask 303 is used as a mask, and the sacrificial film 302 is isotropically etched and removed using the CDE or the like. Here, the interface between the sacrificial film 302 and the element isolation film 234 is in the trench TR. Thus, since the sacrificial film 302 is removed, the upper surface of the element isolation film 234 remains in the trench TR, and the cavity 320 does not reach the element isolation region (trench TR2). Next, the hard mask 303 is removed. At this time, since the hard mask 303 includes a silicon oxide film, as illustrated in FIG. 32, the insulation film 301 on the sidewall of the trench TR, and the insulation film 312 in the trench TR are also partially removed together with the hard mask 303. However, in the eighth embodiment, the cavity 320 does not reach the element isolation region (trench TR2). Accordingly, the cavity 320 of the trench TR does not reach the side surface S234 of the element isolation film 234. Therefore, the thermal oxide film 311 on the side surface S234 of the element isolation film 234 is maintained.

Next, as necessary, the fixed charge film (not illustrated) is deposited on the inner wall of the trench TR.

Figure 33:
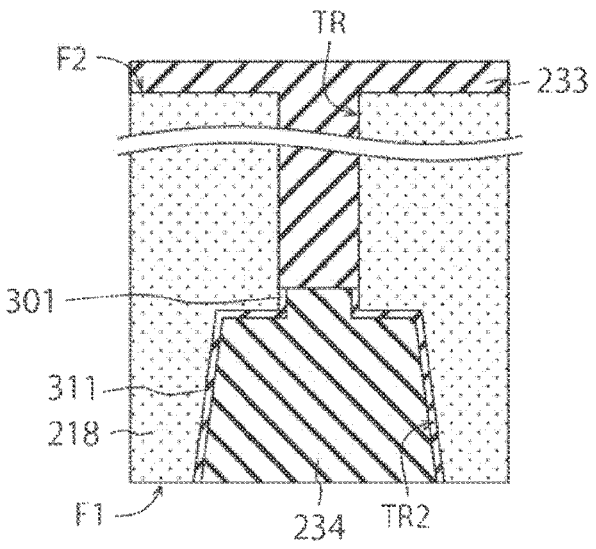
FIG. 33 is a cross-sectional view illustrating an example of a manufacturing method subsequent to FIG. 32.

Next, as illustrated in FIG. 33, the trench TR is filled with the pixel isolation film 233. At this time, the pixel isolation film 233 also fills the cavity 320. The interface between the pixel isolation film 233 and the element isolation film 234 is formed in the trench TR. Therefore, the pixel isolation film 233 remains in the trench TR and is not formed in the element isolation region (trench TR2). The pixel isolation film 233 is not exposed from the side surface S234 of the element isolation film 234 and is not in contact with the substrate 218. That is, on the side surface S234 of the element isolation film 234, the pixel isolation film 233 does not have an interface with the substrate 218. The interface between the pixel isolation film 233 and the element isolation film 234 is in the trench TR, and is not exposed on the side surface S234 of the element isolation film 234.

Thereafter, as in the other embodiments, the light shielding film, the planarization film, and the color filter are formed, and the on-chip lens is further formed on the color filter. As a result, the solid-state imaging element according to the eighth embodiment is made.

According to the eighth embodiment, the end of the pixel isolation film 233 on the first surface F1 side is not exposed from the side surface S234 of the element isolation film 234, and the pixel isolation film 233 is separated from the depletion layer 300. Therefore, the eighth embodiment can obtain the effects similar to those of the seventh embodiment.

Ninth Embodiment

Figure 34:
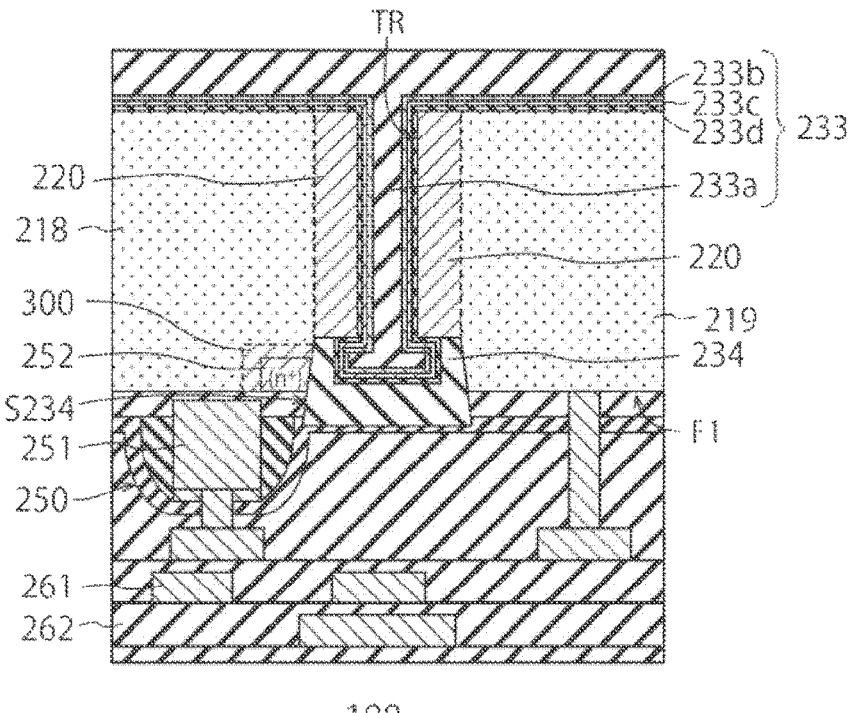
FIG. 34 is a cross-sectional view illustrating a partial configuration example of a pixel according to a ninth embodiment.

FIG. 34 is a cross-sectional view illustrating a partial configuration example of a pixel 100 according to the ninth embodiment. In the ninth embodiment, the pixel isolation film 233 is formed by a stacked film. Other configurations of the ninth embodiment may be similar to those corresponding to the seventh and eighth embodiments.

The pixel isolation film 233 is a stacked film including a plurality of partial films 233a to 233d. The partial film 233d covers the inner wall of the trench TR. The partial film 233c covers the inner wall of the trench TR via the partial film 233d. The partial film 233b covers the inner wall of the trench TR via the partial films 233d and 233c. Moreover, the partial film 233a fills the inner wall of the trench TR via the partial films 233b to 233d. The partial film 233a is, for example, an insulation film such as a silicon oxide film, the partial films 233b and 233c are, for example, metal films (for example, copper, tungsten, and the like) having high light shielding properties, and the partial film 233d is, for example, an insulation film such as a silicon oxide film and electrically isolates the partial films 233b and 233c from the substrate 218. Furthermore, the partial film 233d may be a fixed charge film or a low refractive index film.

Other configurations of the ninth embodiment may be similar to those of the seventh embodiment. Therefore, the ninth embodiment can obtain the effects similar to those of the seventh embodiment.

Tenth Embodiment

Figure 35:
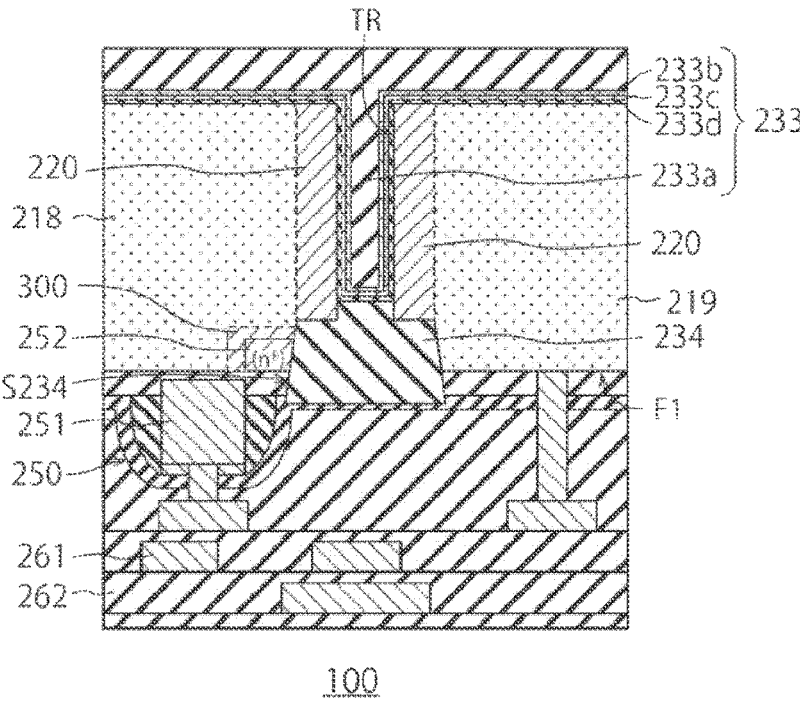
FIG. 35 is a cross-sectional view illustrating a partial configuration example of a pixel according to a modification example of a tenth embodiment.
Figure 36:
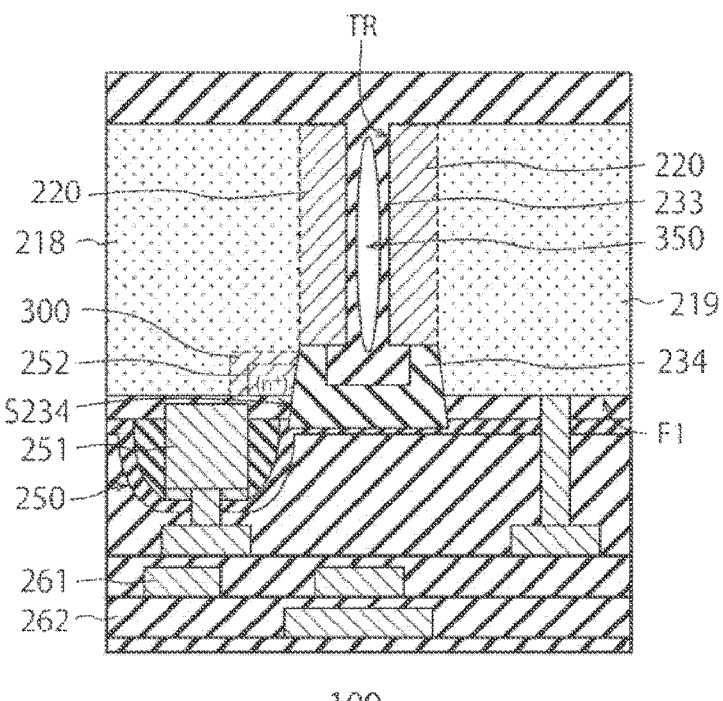
FIG. 36 is a cross-sectional view illustrating a partial configuration example of a pixel according to an eleventh embodiment.
Figure 37:
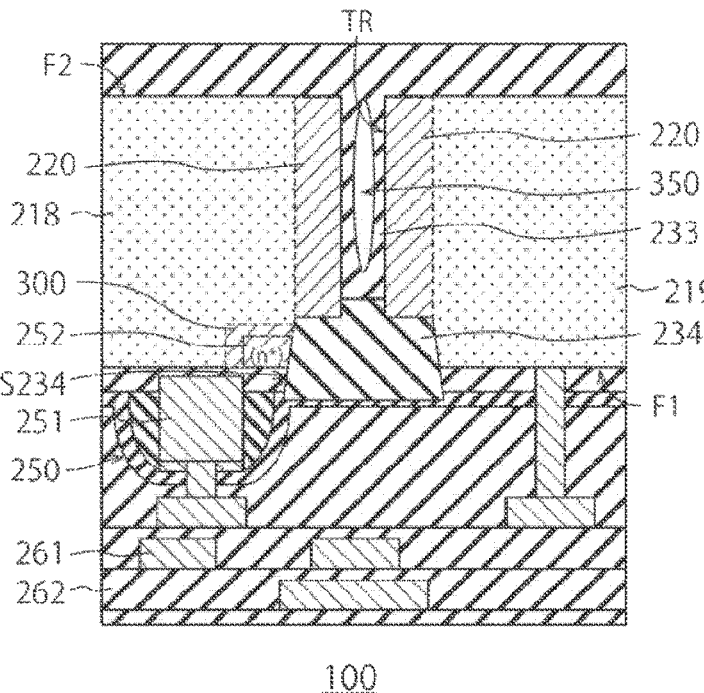
FIG. 37 is a cross-sectional view illustrating a partial configuration example of a pixel according to the eleventh embodiment.
Figure 38:
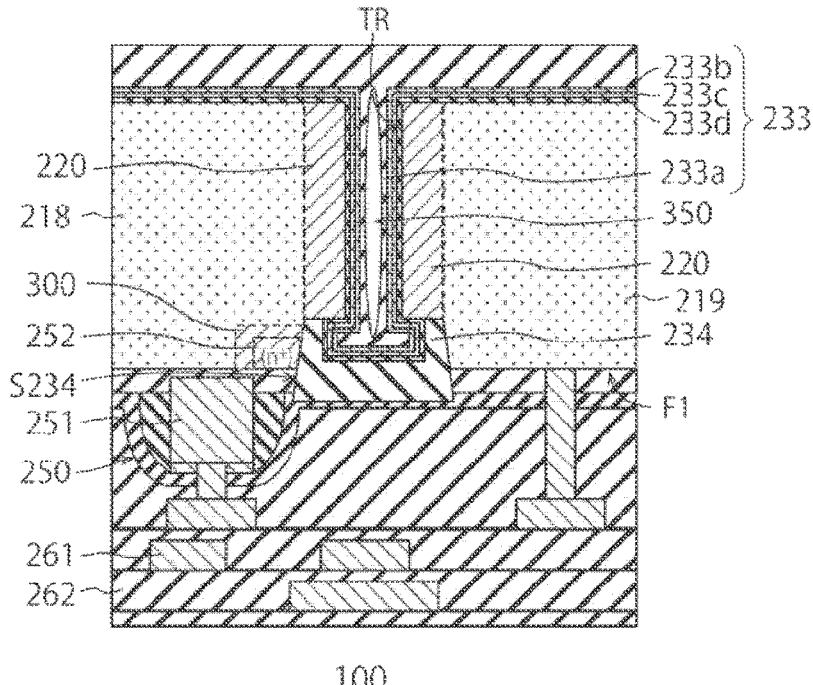
FIG. 38 is a cross-sectional view illustrating a partial configuration example of a pixel according to the eleventh embodiment.
Figure 39:
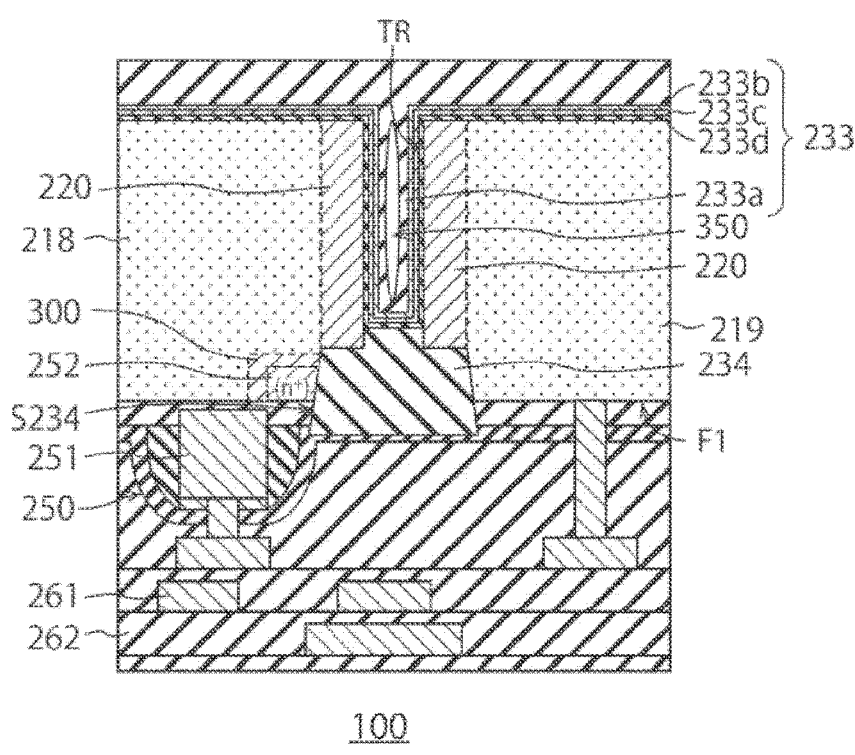
FIG. 39 is a cross-sectional view illustrating a partial configuration example of a pixel according to the eleventh embodiment.

FIG. 35 is a cross-sectional view illustrating a partial configuration example of a pixel 100 according to a modification example of the tenth embodiment. The tenth embodiment is a combination of the eighth and ninth embodiments. Thus, in the tenth embodiment, the pixel isolation film 233 is formed by a stacked film, and the interface between the pixel isolation film 233 and the element isolation film 234 is in the trench TR. The configuration of the pixel isolation film 233 may be the same as those in the ninth embodiment. Other configurations of the tenth embodiment may be similar to those of the eighth embodiment. Therefore, the tenth embodiment can obtain the effects similar to those of the eighth and ninth embodiments.

Eleventh Embodiment

FIGS. 36 to 39 are cross-sectional views illustrating a partial configuration example of a pixel 100 according to the eleventh embodiment. In the eleventh embodiment, a cavity (air gap, void, or seam) 350 is formed in the pixel isolation film 233. FIGS. 36 to 39 correspond to the seventh to tenth embodiments, respectively, and a cavity 350 is provided in each pixel isolation film 233. As described above, even when the cavity 350 is provided in the pixel isolation film 233, the effect of each embodiment is not changed.

Note that the present technology can also have the following configurations.

(1)

A solid-state imaging element including:

a substrate;

a plurality of photoelectric conversion units that is provided in the substrate;

a first insulation film that is provided between the plurality of photoelectric conversion units adjacent to each other among the plurality of photoelectric conversion units, and has a fixed charge provided on an inner wall of a trench penetrating between a first surface of the substrate and a second surface opposite to the first surface;

a second insulation film that is provided on an inner side of the first insulation film in the trench;

at least one transistor that is provided on the first surface of the substrate; and a third insulation film that is provided on both sides of the trench or along the trench when viewed from the first surface.

(2)

The solid-state imaging element according to (1), in which the third insulation film is interposed between a charge induction layer formed on a surface of the substrate adjacent to the first insulation film and a source or drain of the transistor.

(3)

The solid-state imaging element according to (2), in which the charge induction layer is a high-concentration charge layer of a first conductivity type, and the source or drain of the transistor is a high-concentration impurity diffusion layer of a second conductivity type.

(4)

The solid-state imaging element according to (2) or (3), in which the charge induction layer is an impurity diffusion layer of a first conductivity type.

(5)

The solid-state imaging element according to any one of (1) to (4), in which the third insulation film covers ends of the first and second insulation films on the first surface side.

(6)

The solid-state imaging element according to any one of (1) to (4), in which the ends of the first and second insulation films on the first surface side penetrate the third insulation film.

(7)

The solid-state imaging element according to any one of (1) to (6), further including:

a wiring layer that is provided on the first surface of the substrate and electrically connected to the transistor; and a lens that is provided on the second surface of the substrate.

(8)

The solid-state imaging element according to any one of (1) to (7), further including a light shielding film that is provided on an inner side of the second insulation film in the trench.

(9)

The solid-state imaging element according to any one of (1) to (8), in which the third insulation film overlaps the first and second insulation films when the substrate is viewed from a direction perpendicular to the first surface.

(10)

The solid-state imaging element according to any one of (1) to (8), in which a width of the third insulation film is greater than a width of the trench when the substrate is viewed from a direction substantially perpendicular to the first surface.

(11)

The solid-state imaging element according to any one of (2) to (4), in which a width of the third insulation film is greater than a width of the charge induction layer provided on both sides of the trench when the substrate is viewed from a direction substantially perpendicular to the first surface.

(12)

The solid-state imaging element according to any one of (1) to (11), in which a depth of the third insulation film from the first surface is deeper than a depth of a diffusion layer of the transistor adjacent to the third insulation film.

(13)

A manufacturing method of a solid-state imaging element, the method including:

forming a plurality of photoelectric conversion units in a substrate;

forming, on a first surface of the substrate, a third insulation film between the photoelectric conversion units adjacent to each other among the plurality of photoelectric conversion units;

forming, between the plurality of adjacent photoelectric conversion units, a trench penetrating between the first surface of the substrate and a second surface opposite to the first surface;

forming, on an inner wall of the trench, a first insulation film having a fixed charge;

forming, in the trench, a second insulation film on an inner side of the first insulation film; and forming at least one transistor on the first surface of the substrate.

(14)

The method according to (13), further including introducing an impurity of a first conductivity type into the inner wall of the trench to form a charge induction layer on the inner wall of the trench.

(15)

The method according to (13) or (14), in which the trench penetrates the third insulation film.

(16)

A solid-state imaging element including:

a substrate;

a plurality of photoelectric conversion units that is provided in the substrate;

a second insulation film that is provided between the plurality of photoelectric conversion units adjacent to each other among the plurality of photoelectric conversion units and provided in a trench penetrating between a first surface of the substrate and a second surface opposite to the first surface;

a third insulation film that is provided on the first surface of the substrate and provided on both sides of the trench or along the trench when viewed from the first surface, the third insulation film being wider than the second insulation film; and an impurity diffusion layer that is provided on the first surface of the substrate and in contact with a side surface of the third insulation film, in which the second insulation film is not exposed from the side surface of the third insulation film.

(17)

The solid-state imaging element according to (16), in which an interface between the second insulation film and the third insulation film is in the third insulation film.

(18)

The solid-state imaging element according to (16), in which an interface between the second insulation film and the third insulation film is in the trench.

(19)

The solid-state imaging element according to any one of (16) to (18), in which the second insulation film is a stacked film including a plurality of partial films.

(20)

The solid-state imaging element according to (16)19, in which the plurality of partial films is any of a fixed charge film, a low refractive index film, an oxide film, and a metal film.

(21)

The solid-state imaging element according to any one of (16) to (20), in which a cavity is provided in the second insulation film.

(22)

The solid-state imaging element according to any one of (16) to (21), further including:

a wiring layer that is provided on the first surface of the substrate and electrically connected to the impurity diffusion layer; and a lens that is provided on the second surface of the substrate.

(23)

A manufacturing method of a solid-state imaging element, the method including:

forming a plurality of photoelectric conversion units in a substrate;

forming, between the photoelectric conversion units adjacent to each other among the plurality of photoelectric conversion units, a trench extending from a first surface of the substrate to a second surface opposite to the first surface;

forming a sacrificial film in the trench;

forming a third insulation film on the first surface of the substrate, the third insulation film being wider than the trench on both sides of the trench or along the trench when viewed from the first surface;

removing the sacrificial film in the trench from the second surface side of the substrate; and forming a second insulation film in the trench from the second surface side of the substrate.

(24)

The method according to (23), further including removing an upper portion of the third insulation film such that the trench does not extend to a side surface of the third insulation film when the sacrificial film is removed, in which the second insulation film is formed so as not to be exposed from the side surface of the third insulation film when the second insulation film is formed.

(25)

The method according to (23), further including:

partially removing the sacrificial film from the first surface side of the substrate to lower an upper surface of the sacrificial film below the first surface after the sacrificial film is formed;

lowering the upper surface of the sacrificial film into the trench below a bottom surface of the third insulation film when the third insulation film is formed; and removing the sacrificial film from the second surface side of the substrate to form a second insulation film from the second surface side of the substrate into the trench.

Note that the present disclosure is not limited to the above-described embodiments, and various modifications can be made without departing from the gist of the present disclosure. Furthermore, the effects described in the present specification are merely examples and are not limited, and other effects may be provided.

REFERENCE SIGNS LIST

100 Pixel
218 Semiconductor substrate
219 Photodiode
220 Charge induction layer
232 Fixed charge film
233 Element isolation film
234 Element isolation film
214 Light shielding film
213 Planarization film
212 Color filter
211 On-chip lens
250 Transistor
252 Diffusion layer
261 Wiring
262 Interlayer insulation film
235 Light shielding film

The invention claimed is:

1. A solid-state imaging element, comprising:

a substrate;

a plurality of photoelectric conversion units in the substrate;

a first insulation film between a first photoelectric conversion unit of the plurality of photoelectric conversion units and a second photoelectric conversion unit of the plurality of photoelectric conversion units, wherein the first photoelectric conversion unit is adjacent to the second photoelectric conversion unit, the first insulation film has a fixed charge on an inner wall of a trench, the trench penetrates between a first surface of the substrate and a second surface of the substrate, and the second surface of the substrate is opposite to the first surface of the substrate;

a second insulation film on an inner side of the first insulation film in the trench;

at least one transistor on the first surface of the substrate, wherein a charge induction layer is induced by the fixed charge of the first insulation film, the charge induction layer is a high-concentration charge layer of a first conductivity type, one of a source or a drain of the at least one transistor is a high-concentration impurity diffusion layer of a second conductivity type, and the first conductivity type is different from the second conductivity type; and a third insulation film along both sides of the trench when viewed from the first surface of the substrate.

2. The solid-state imaging element according to claim 1, wherein the charge induction layer is on the first surface of the substrate that is adjacent to the first insulation film, and the third insulation film is between the charge induction layer and the one of the source or the drain of the at least one transistor.

3. The solid-state imaging element according to claim 2, wherein the charge induction layer is an impurity diffusion layer of the first conductivity type.

4. The solid-state imaging element according to claim 1, wherein the third insulation film covers an end of each of the first insulation film and the second insulation film on a side of the first surface of the substrate.

5. The solid-state imaging element according to claim 1, wherein an end of each of the first insulation film and the second insulation film penetrates the third insulation film on a side of the first surface of the substrate.

6. The solid-state imaging element according to claim 1, further comprising:

a wiring layer on the first surface of the substrate, wherein the wiring layer is electrically connected to the at least one transistor; and a lens on the second surface of the substrate.

7. The solid-state imaging element according to claim 1, further comprising a light shielding film on an inner side of the second insulation film in the trench.

8. The solid-state imaging element according to claim 1, wherein the third insulation film overlaps the first insulation film and the second insulation film when the substrate is viewed from a direction perpendicular to the first surface of the substrate.

9. The solid-state imaging element according to claim 1, wherein a width of the third insulation film is greater than a width of the trench when the substrate is viewed from a direction substantially perpendicular to the first surface.

10. The solid-state imaging element according to claim 1, wherein the charge induction layer is on the both sides of the trench, and a width of the third insulation film is greater than a width of the charge induction layer when the substrate is viewed from a direction substantially perpendicular to the first surface.

11. The solid-state imaging element according to claim 1, wherein a depth of the third insulation film from the first surface of the substrate is deeper than a depth of a diffusion layer of the at least one transistor that is adjacent to the third insulation film.

12. A manufacturing method of a solid-state imaging element, the method comprising:

forming a plurality of photoelectric conversion units in a substrate;

forming, on a first surface of the substrate, a third insulation film between a first photoelectric conversion unit of the plurality of photoelectric conversion units and a second photoelectric conversion unit of the plurality of photoelectric conversion units, wherein the first photoelectric conversion unit is adjacent to the second photoelectric conversion unit;

forming, between the first photoelectric conversion unit and the second photoelectric conversion unit, a trench, wherein the trench penetrates between the first surface of the substrate and a second surface of the substrate, and the second surface of the substrate is opposite to the first surface of the substrate;

forming, on an inner wall of the trench, a first insulation film having a fixed charge;

forming a charge induction layer, wherein the charge induction layer is induced by the fixed charge of the first insulation film;

forming, in the trench, a second insulation film on an inner side of the first insulation film; and forming at least one transistor on the first surface of the substrate, wherein the charge induction layer is a high-concentration charge layer of a first conductivity type, one of a source or a drain of the at least one transistor is a high-concentration impurity diffusion layer of a second conductivity type, and the first conductivity type is different from the second conductivity type.

13. The method according to claim 12, wherein the trench penetrates the third insulation film.

14. A solid-state imaging element, comprising:

a substrate;

a plurality of photoelectric conversion units in the substrate;

a second insulation film between a first photoelectric conversion unit of the plurality of photoelectric conversion units and a second photoelectric conversion unit of the plurality of photoelectric conversion units, wherein the first photoelectric conversion unit is adjacent to the second photoelectric conversion unit, the second insulation film is in a trench that penetrates between a first surface of the substrate and a second surface of the substrate, and the second surface of the substrate is opposite to the first surface of the substrate;

a third insulation film on the first surface of the substrate, wherein the third insulation film is along both sides of the trench when viewed from the first surface of the substrate, and the third insulation film is wider than the second insulation film; and an impurity diffusion layer of a transistor on the first surface of the substrate, wherein the impurity diffusion layer of the transistor is in contact with a side surface of the third insulation film, a charge induction layer is induced by a fixed charge of the second insulation film, the charge induction layer is a high-concentration charge layer of a first conductivity type, the impurity diffusion layer of the transistor is of a second conductivity type, the first conductivity type is different from the second conductivity type, and the second insulation film is unexposed from the side surface of the third insulation film.

15. The solid-state imaging element according to claim 14, wherein an interface between the second insulation film and the third insulation film is in the third insulation film.

16. The solid-state imaging element according to claim 14, wherein an interface between the second insulation film and the third insulation film is in the trench.

17. The solid-state imaging element according to claim 14, wherein the second insulation film is a stacked film including a plurality of partial films.

18. The solid-state imaging element according to claim 17, wherein the plurality of partial films is at least one of a fixed charge film, a low refractive index film, an oxide film, or a metal film.

19. The solid-state imaging element according to claim 5, wherein a cavity is in the second insulation film.

20. The solid-state imaging element according to claim 14, further comprising:

a wiring layer on the first surface of the substrate wherein the wiring layer is electrically connected to the impurity diffusion layer; and a lens on the second surface of the substrate.

21. A manufacturing method of a solid-state imaging element, the method comprising:

forming a plurality of photoelectric conversion units in a substrate;

forming a trench between a first photoelectric conversion unit of the plurality of photoelectric conversion units and a second photoelectric conversion unit of the plurality of photoelectric conversion units, wherein the first photoelectric conversion unit is adjacent to the second photoelectric conversion unit, the trench extends from a first surface of the substrate to a second surface of the substrate, and the second surface of the substrate is opposite to the first surface of the substrate;

forming a sacrificial film in the trench;

forming a third insulation film on the first surface of the substrate, wherein the third insulation film is wider than the trench along both sides of the trench when viewed from the first surface of the substrate;

removing the sacrificial film in the trench from a side of the second surface of the substrate; and forming a second insulation film in the trench from the side of the second surface of the substrate.

22. The method according to claim 21, further comprising removing an upper portion of the third insulation film such that the trench does not extend to a side surface of the third insulation film when the sacrificial film is removed, wherein the second insulation film is formed such that the second insulation film is unexposed from the side surface of the third insulation film when the second insulation film is formed.

23. The method according to claim 21, further comprising:

partially removing the sacrificial film from a side of the first surface of the substrate to lower an upper surface of the sacrificial film below the first surface of the substrate, wherein the sacrificial film is partially removed after the sacrificial film is formed;

lowering the upper surface of the sacrificial film into the trench below a bottom surface of the third insulation film when the third insulation film is formed; and removing the sacrificial film from the side of the second surface of the substrate to form the second insulation film from the side of the second surface of the substrate into the trench.

* * * * *